US008004377B2

(12) United States Patent
Brusky et al.

(10) Patent No.: US 8,004,377 B2
(45) Date of Patent: Aug. 23, 2011

(54) INDICATOR FOR A FAULT INTERRUPTER AND LOAD BREAK SWITCH

(75) Inventors: Nicholas Brusky, Milwaukee, WI (US); Kurt Lawrence Lindsey, West Allis, WI (US)

(73) Assignee: Cooper Technologies Company, Houston, TX (US)

(*) Notice: Subject to any disclaimer, the term of this patent is extended or adjusted under 35 U.S.C. 154(b) by 642 days.

(21) Appl. No.: 12/117,456

(22) Filed: May 8, 2008

(65) Prior Publication Data

US 2009/0278636 A1 Nov. 12, 2009

(51) Int. Cl.

| | |
|---|---|
| ***H01H 77/00*** | (2006.01) |
| ***H01H 83/00*** | (2006.01) |
| ***G01R 19/14*** | (2006.01) |
| ***G01R 31/08*** | (2006.01) |
| ***G08B 21/00*** | (2006.01) |

(52) U.S. Cl. .......... 335/17; 335/125; 324/133; 324/524; 324/529; 340/664

(58) Field of Classification Search .................... 335/17, 335/125; 324/133, 524, 529; 340/664
See application file for complete search history.

(56) References Cited

U.S. PATENT DOCUMENTS

| | | | |
|---|---|---|---|
| 1,943,011 | A | 1/1934 | Fryar |
| RE021,527 | E | 8/1940 | Smulski |
| 2,411,351 | A | 11/1946 | Armstrong |
| 2,466,072 | A | 4/1949 | Batcheller |
| 2,523,370 | A | 9/1950 | Jeffrey |
| 2,540,294 | A | 2/1951 | Schleicher |
| 2,558,412 | A | 6/1951 | Baldwin |
| 2,591,017 | A | 4/1952 | Schultz |
| 2,858,384 | A | 10/1958 | Taylor et al. |
| 2,990,878 | A | 7/1961 | Larsen |
| 3,246,100 | A | 4/1966 | Russell |
| 3,272,945 | A | 9/1966 | Flook, Jr. et al. |

(Continued)

FOREIGN PATENT DOCUMENTS

CN 1698150 A 11/2005

(Continued)

OTHER PUBLICATIONS

The International Search Report and Written Opinion issued Jul. 2, 2009 for corresponding PCT application PCT/US2009/042946 (13 sheets).

(Continued)

*Primary Examiner* — Anh T Mai
*Assistant Examiner* — Mohamad A Musleh
(74) *Attorney, Agent, or Firm* — King & Spalding LLP

(57) ABSTRACT

A fault interrupter and load break switch includes a trip assembly configured to automatically open a transformer circuit electrically coupled to stationary contacts of the switch upon the occurrence of a fault condition. The fault condition causes a Curie metal element electrically coupled to at least one of the stationary contacts to release a magnetic latch. The release causes a trip rotor of the trip assembly to rotate a rotor assembly. This rotation causes ends of a movable contact of the rotor assembly to electrically disengage the stationary contacts, thereby opening the circuit. The switch also includes a handle for manually opening and closing the electrical circuit in fault and non-fault conditions. Actuation of the handle coupled to the rotor assembly via a spring-loaded rotor causes the movable contact ends to selectively engage or disengage the stationary contacts.

22 Claims, 20 Drawing Sheets

U.S. PATENT DOCUMENTS

| | | | | | |
|---|---|---|---|---|---|
| 3,289,131 | A | | 11/1966 | Watkins et al. | |
| 3,316,367 | A | | 4/1967 | Kowalski | |
| 3,430,170 | A | * | 2/1969 | Stanley et al. | 335/234 |
| 3,451,055 | A | * | 6/1969 | Pihl | 340/815.63 |
| 3,582,856 | A | | 6/1971 | Watrous et al. | |
| 3,590,183 | A | | 6/1971 | Leonard | |
| 3,634,857 | A | * | 1/1972 | Pihl | 340/815.63 |
| 3,715,543 | A | | 2/1973 | Keto et al. | |
| 3,789,172 | A | | 1/1974 | Cole et al. | |
| 3,940,584 | A | | 2/1976 | Cauldwell et al. | |
| 3,944,772 | A | | 3/1976 | Davies | |
| 4,032,870 | A | | 6/1977 | Oppel et al. | |
| 4,080,582 | A | | 3/1978 | Link | |
| 4,132,986 | A | * | 1/1979 | Hart et al. | 340/815.63 |
| 4,226,211 | A | | 10/1980 | Barrentine | |
| 4,234,847 | A | * | 11/1980 | Schweitzer | 324/146 |
| 4,245,140 | A | | 1/1981 | Jencks et al. | |
| 4,262,216 | A | | 4/1981 | Johnston | |
| 4,268,890 | A | | 5/1981 | Silbermann | |
| 4,288,769 | A | | 9/1981 | Howell | |
| 4,383,231 | A | | 5/1983 | Yamanaka et al. | |
| 4,412,116 | A | | 10/1983 | Golub | |
| 4,424,512 | A | * | 1/1984 | Schweitzer, Jr. | 340/664 |
| 4,427,860 | A | | 1/1984 | Eley | |
| 4,435,690 | A | | 3/1984 | Link et al. | |
| 4,438,403 | A | | 3/1984 | Schweitzer, Jr. | |
| 4,536,758 | A | * | 8/1985 | Schweitzer, Jr. | 340/664 |
| 4,550,298 | A | | 10/1985 | Mikulecky | |
| 4,554,420 | A | | 11/1985 | Golub | |
| 4,591,816 | A | | 5/1986 | Mikulecky et al. | |
| 4,611,189 | A | | 9/1986 | Mikulecky | |
| 4,737,878 | A | | 4/1988 | Mikulecky | |
| 4,795,982 | A | * | 1/1989 | Schweitzer, Jr. | 324/508 |
| 4,873,706 | A | * | 10/1989 | Schweitzer, Jr. | 377/85 |
| 5,021,615 | A | | 6/1991 | Muench et al. | |
| 5,070,252 | A | | 12/1991 | Castenschiold et al. | |
| 5,220,311 | A | * | 6/1993 | Schweitzer, Jr. | 340/650 |
| 5,252,933 | A | | 10/1993 | Kamino et al. | |
| 5,278,530 | A | * | 1/1994 | Zovath | 335/17 |
| 5,351,024 | A | | 9/1994 | Juds et al. | |
| 5,552,647 | A | | 9/1996 | Tinkham | |
| 5,726,621 | A | | 3/1998 | Whitney et al. | |
| 5,925,405 | A | | 7/1999 | Ali-Khan | |
| 6,037,555 | A | | 3/2000 | Castonguay et al. | |
| 6,069,331 | A | | 5/2000 | Utke | |
| 6,133,723 | A | * | 10/2000 | Feight | 324/133 |
| 6,147,416 | A | | 11/2000 | Mitsuzuka | |
| 6,218,920 | B1 | | 4/2001 | Reichard et al. | |
| 6,281,458 | B1 | | 8/2001 | Castonguay et al. | |
| 6,403,909 | B1 | | 6/2002 | Green et al. | |
| 6,559,743 | B2 | | 5/2003 | Narayanan et al. | |
| 6,566,618 | B2 | | 5/2003 | Hamada et al. | |
| 6,590,173 | B2 | | 7/2003 | Uchida et al. | |
| 6,703,575 | B1 | | 3/2004 | Yamamoto | |
| 6,768,412 | B2 | | 7/2004 | Becka et al. | |
| 6,781,504 | B2 | | 8/2004 | Scott et al. | |
| 6,791,440 | B2 | | 9/2004 | Harmon et al. | |
| 6,794,595 | B2 | | 9/2004 | Charles et al. | |
| 6,797,909 | B2 | | 9/2004 | Pride et al. | |
| 6,825,426 | B2 | | 11/2004 | Muench et al. | |
| 6,839,207 | B2 | | 1/2005 | Folliot et al. | |
| 6,930,271 | B1 | | 8/2005 | Palmieri et al. | |
| 7,002,440 | B2 | | 2/2006 | Attarian et al. | |
| 7,019,606 | B2 | | 3/2006 | Williams et al. | |
| 7,199,686 | B1 | | 4/2007 | Tsai | |
| 7,330,097 | B2 | | 2/2008 | Takeda | |
| 7,623,010 | B2 | | 11/2009 | Liu | |
| 7,683,287 | B2 | | 3/2010 | Lindsey et al. | |
| 2003/0032892 | A1 | | 2/2003 | Erlach et al. | |
| 2003/0187550 | A1 | | 10/2003 | Wilson et al. | |
| 2004/0094394 | A1 | | 5/2004 | Muench et al. | |
| 2004/0100741 | A1 | | 5/2004 | Bosga et al. | |
| 2004/0150504 | A1 | | 8/2004 | Nicholson | |
| 2004/0169014 | A1 | | 9/2004 | Pride et al. | |
| 2005/0003199 | A1 | | 1/2005 | Takaya et al. | |
| 2005/0212629 | A1 | | 9/2005 | Williams et al. | |
| 2006/0152308 | A1 | | 7/2006 | Rajauria et al. | |
| 2007/0138143 | A1 | | 6/2007 | Muench et al. | |
| 2007/0161270 | A1 | | 7/2007 | Insalaco et al. | |
| 2007/0222467 | A1 | | 9/2007 | Nickson | |
| 2009/0277768 | A1 | | 11/2009 | Brusky et al. | |
| 2009/0278635 | A1 | | 11/2009 | Lindsey et al. | |
| 2009/0279216 | A1 | | 11/2009 | Brusky et al. | |
| 2009/0279223 | A1 | | 11/2009 | Brusky et al. | |
| 2010/0013583 | A1 | * | 1/2010 | Kimura | 335/294 |
| 2010/0038220 | A1 | | 2/2010 | Lindsey et al. | |
| 2010/0038221 | A1 | | 2/2010 | Lindsey et al. | |
| 2010/0038222 | A1 | | 2/2010 | Lindsey | |
| 2010/0142102 | A1 | | 6/2010 | Brusky | |

FOREIGN PATENT DOCUMENTS

| | | | |
|---|---|---|---|
| EP | 0034966 | A1 | 7/1984 |
| EP | 0727858 | A3 | 8/1996 |
| GB | 382656 | | 10/1932 |
| TW | 278039 | | 10/2005 |
| WO | WO9919891 | A1 | 4/1999 |
| WO | WO9960591 | A1 | 11/1999 |
| WO | WO0175919 | A1 | 10/2001 |

OTHER PUBLICATIONS

Cooper Power Systems, OEM Equipment, Four-Position Sectionalizing Loadbreak Switches, Electrical Apparatus 800-64, Dec. 2003 (8 pages).

Cooper Power Systems, Fusing Equipment, MagneX™ Single-Phase Interrupter, Electrical Apparatus 240-34, Mar. 2006 (7 pages).

Shanghai Huaming Power Equipment Company brochure (4 pages).

Jaker Electric Co., Ltd., Taiwan, ROC; "Pole Mount Transformer Integrated Service" brochure, pp. 1-8; copy attached; also see brochure at http://www.jaker.com.tw/np_pole01.htm; Sep. 23, 2006.

* cited by examiner

INDICATOR FOR A FAULT INTERRUPTER AND LOAD BREAK SWITCH

RELATED PATENT APPLICATION

This patent application is related to co-pending U.S. patent application Ser. No. 12/117,463, entitled "Fault Interrupter and Load Break Switch," filed May 8, 2008; U.S. patent application Ser. No. 12/117,449, entitled "Multiple Arc Chamber Assemblies for a Fault Interrupter and Load Break Switch," filed May 8, 2008; U.S. patent application Ser. No. 12/117,470, entitled "Low Oil Trip Assembly for a Fault Interrupter and Load Break Switch," filed May 8, 2008; U.S. patent application Ser. No. 12/117,474, entitled "Adjustable Rating for a Fault Interrupter and Load Break Switch," filed May 8, 2008; and U.S. patent application Ser. No. 12/117,444, entitled "Sensor Element for a Fault Interrupter and Load Break Switch," filed May 8, 2008. The complete disclosure of each of the foregoing related applications is hereby fully incorporated herein by reference.

TECHNICAL FIELD

The present disclosure relates generally to a fault interrupter and load break switch, and more particularly, to a fault interrupter and load break switch for a dielectric fluid-filled transformer.

BACKGROUND OF THE INVENTION

A transformer is a device that transfers electrical energy from a primary circuit to a secondary circuit by magnetic coupling. Typically, a transformer includes one or more windings wrapped around a core. An alternating voltage applied to one winding (a "primary winding") creates a time-varying magnetic flux in the core, which induces a voltage in the other ("secondary") winding(s). Varying the relative number of turns of the primary and secondary windings about the core determines the ratio of the input and output voltages of the transformer. For example, a transformer with a turn ratio of 2:1 (primary:secondary) has an input voltage that is two times greater than its output voltage.

It is well known in the art to cool high-power transformers using a dielectric fluid, such as a highly-refined mineral oil. The dielectric fluid is stable at high temperatures and has excellent insulating properties for suppressing corona discharge and electric arcing in the transformer. Typically, the transformer includes a tank that is at least partially filled with the dielectric fluid. The dielectric fluid surrounds the transformer core and windings.

Over-current protection devices are widely used to prevent damage to the primary and secondary circuits of transformers. For example, distribution transformers have conventionally been protected from fault currents by high voltage fuses provided on the primary windings. Each fuse includes fuse terminations configured to form an electrical connection between the primary winding and an electrical power source in the primary circuit. A fusible link or element disposed between the fuse terminations is configured to melt, disintegrate, fail, or otherwise open to break the primary electrical circuit when electrical current through the fuse exceeds a predetermined limit. Upon clearing a fault, the fuse becomes inoperable and must be replaced. Methods and safety practices for determining if the fuse is damaged and for replacing the fuse can be lengthy and complicated.

Another over-current protection device that has conventionally been used is a circuit breaker. A traditional circuit breaker has a low voltage rating, requiring the circuit breaker to be installed in the secondary circuit, rather than the primary circuit, of the transformer. The circuit breaker does not protect against faults in the primary circuit. Rather, a high voltage fuse must be used in addition to the circuit breaker to protect the primary circuit.

Secondary circuit breakers are large. Transformer tanks must increase in size to accommodate the large secondary circuit breakers. As the size of the transformer tank increases, the cost of acquiring and maintaining the transformer increases. For example, a larger transformer requires more space and more tank material. The larger transformer also requires more dielectric fluid to fill the transformer's larger tank.

A load break switch is a switch for opening a circuit when current is flowing. Traditionally, load break switches have been used to selectively open and close the primary and secondary circuits of a transformer. The load break switches do not include fault sensing or fault interrupting functionality. Thus, a high voltage fuse and/or a secondary circuit breaker must be used in addition to the load break switch. The large size of the load break switch and the extra device employed for fault protection require a much larger, and more expensive, transformer tank.

Therefore, a need exists in the art for improved load break switches and over-current protection devices for dielectric fluid-filled transformers. In addition, a need exists in the art for such devices to be cost-effective and user friendly. A further need exists in the art for such devices to be relatively compact.

SUMMARY OF THE INVENTION

The invention provides a load break switch and an over-current protection device in a single, relatively compact and easy to use apparatus. Referred to herein as a "fault interrupter and load break switch" or a "switch," the apparatus includes a trip assembly configured to automatically open an electrical circuit associated with the apparatus upon the occurrence of a fault condition. The apparatus also includes a handle for manually or automatically opening and closing the electrical circuit in fault and non-fault conditions.

In certain exemplary embodiments, the switch includes at least one arc chamber assembly within which a pair of stationary contacts is disposed. The stationary contacts are electrically coupled to a circuit of a transformer. For example, the stationary contacts can be electrically coupled to a primary circuit of the transformer. Ends of a movable contact of a rotor assembly rotatable within the arc chamber assembly are configured to selectively electrically engage and disengage the stationary contacts.

When the ends of the movable contact engage the stationary contacts, the circuit is closed. Current in the closed circuit flows through one of the stationary contacts into one of the ends of the movable contact, and through the other end of the movable contact to the other stationary contact. When the ends of the movable contact disengage the stationary contacts, the circuit is open, as current in the circuit cannot flow between the disengaged movable contact ends and stationary contacts.

In certain exemplary embodiments, a Curie metal element is electrically coupled to one of the stationary contacts, in the circuit. For example, the Curie metal element can be electrically connected between a primary winding of the transformer and one of the stationary contacts. The Curie metal element includes a material, such as a nickel-iron alloy, which loses its magnetic properties when it is heated beyond a predetermined temperature, i.e., a Curie transition temperature. For example, the Curie metal element may be heated to the Curie transition temperature during a high current surge in the transformer primary winding, or when hot dielectric fluid conditions occur in the transformer.

When the Curie metal element attains a temperature higher than the Curie transition temperature, magnetic coupling is lost (or "released" or "tripped") between the Curie metal element and a magnet of a trip assembly of the switch. This release causes the electrical circuit, including the transformer primary winding, to open. Specifically, the loss of magnetic coupling causes a return spring of the trip assembly to actuate a first end of a rocker (which is coupled to the magnet) away from the Curie metal element. The return spring also actuates a second, opposite end of the rocker towards a top surface of the arc chamber assembly.

This actuation causes the second end of the rocker to move away from an edge of a trip rotor of the trip assembly, thereby releasing a mechanical force between the rocker and the trip rotor. A spring force from a trip spring coupled to the trip rotor causes the trip rotor to rotate about an aperture of the arc chamber assembly. This rotation causes similar rotation of the rotor assembly, which is coupled to the trip rotor. When the rotor assembly rotates, the ends of the movable contact move away from the stationary contacts, thereby opening the electrical circuit coupled thereto.

The electrical circuit is opened in two places—a junction between a first pair of the movable contact ends and stationary contacts and a junction between a second pair of the movable contact ends and stationary contacts. This "double break" of the circuit increases a total arc length of an electric arc generated during the circuit opening. This increased arc length increases the arc's voltage, making the arc easier to extinguish. The increased arc length also helps to prevent arc re-initiation, also called "restrikes."

Vents within the arc chamber assembly are configured to allow ingress and egress of dielectric fluid for extinguishing the arc. Internally, arc chamber walls leading to the vents can be designed in smooth up and down transitions and without perpendicular walls or other obstructions to the flow of dielectric fluid and arc gasses. Obstructions could cause turbulence in the flow of fluid and gas during circuit opening. Obstructions to flow and turbulence could in turn prevent the arc from being moved to the location within the arc chamber, at the proper time, that is best suited for extinguishing the arc. The vents also are sized and shaped to prevent the arc from traveling outside the arc chamber assembly and striking the tank wall or other internal transformer components.

In certain alternative exemplary embodiments, a solenoid can be used instead of the Curie metal element, magnet, and spring to actuate the rocker. Other alternatives include a bimetal element and a shape memory metal element. The solenoid can be operated through electronic controls. The electronic controls may provide greater flexibility in selecting trip parameters such as trip times, trip currents, trip temperatures, and reset times. The electronic controls also may allow for switch operation via remote wireless or hard wired means of communications.

In a manual operation of the switch, actuation of a handle coupled to the rotor assembly via a spring-loaded rotor causes the movable contact ends to selectively engage or disengage the stationary contacts. The primary function of the spring-loaded rotor is to minimize arcing between the stationary contacts and the ends of the movable contact in the arc chamber assembly by very rapidly driving the contacts into their open or closed positions. Thus, rotor rotational speed can be consistent, independent of handle speed, which may be under inconsistent operator control.

An operator can use the handle to open and close the circuit in fault and non-fault conditions. For example, the operator can rotate the handle to close a circuit that previously had been opened in response to a fault condition. Thus, the operator can manually reset the switch to a closed position. In certain exemplary embodiments, a motor can be coupled to the handle and/or the spring-loaded rotor for automatic, remote operation of the switch.

In certain exemplary embodiments, the switch includes multiple arc chamber assemblies. The trip assembly of the switch is configured to open and close one or more circuits electrically coupled to the arc chamber assemblies, substantially as described above. Movable contact assemblies within each arc chamber assembly are coupled to one another and are configured to rotate substantially co-axially with one another. Thus, an opening or closing operation of the switch will cause similar rotation of each rotor assembly.

The arc chamber assemblies may be connected in series or in parallel. An in-parallel connection allows a single switch to control multiple different circuits. An in-series connection increases the voltage capacity of the switch. For example, if a single arc chamber assembly can interrupt 8,000 volts at 3,000 amps AC, then a combination of three arc chamber assemblies may interrupt 24,000 volts at 3,000 amps AC.

These and other aspects, features and embodiments of the invention will become apparent to a person of ordinary skill in the art upon consideration of the following detailed description of illustrated embodiments exemplifying the best mode for carrying out the invention as presently perceived.

BRIEF DESCRIPTION OF THE DRAWINGS

FIG. 3, comprising

FIG. 15, comprising

DETAILED DESCRIPTION

The following description of exemplary embodiments of the invention refers to the attached drawings, in which like numerals indicate like elements throughout the several figures.

Figure 1:
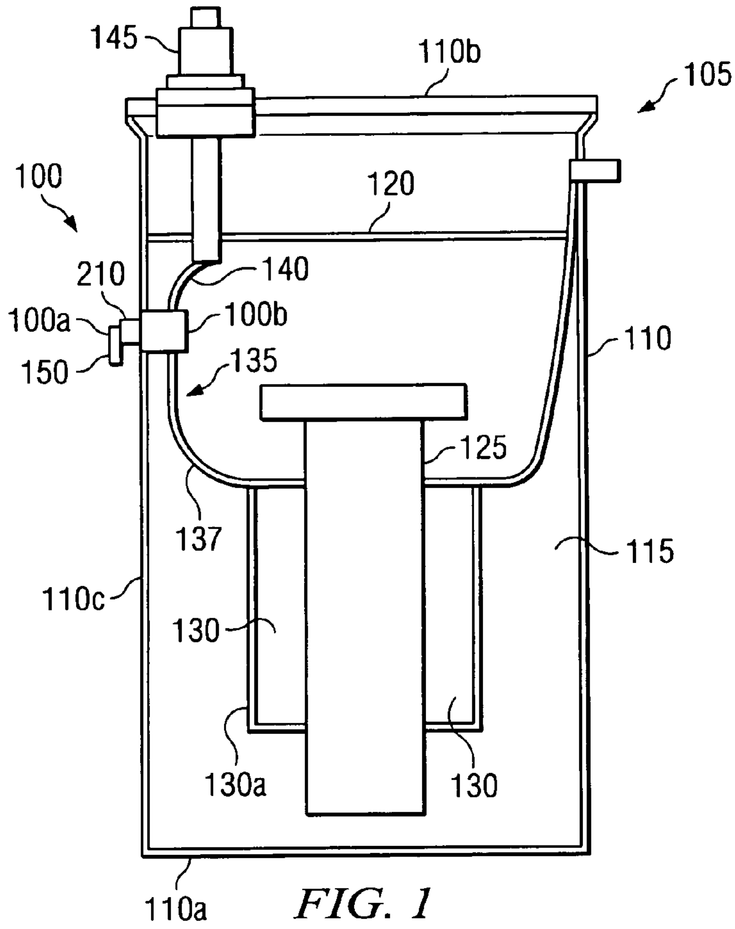
FIG. 1 is a cross-sectional perspective view of an exemplary fault interrupter and load break switch mounted to a tank wall of a transformer, in accordance with certain exemplary embodiments.

FIG. 1 is a cross-sectional perspective view of an exemplary fault interrupter and load break switch 100 mounted to a tank wall 110*c* of a transformer 105, in accordance with certain exemplary embodiments. The transformer 105 includes a tank 110 that is at least partially filled with a dielectric fluid 115. The dielectric 115 fluid includes any fluid that can act as an electrical insulator. For example, the dielectric fluid can include mineral oil. The dielectric fluid 115 extends from a bottom 110*a* of the tank 110 to a height 120 proximate a top 110*b* of the tank 110. The dielectric fluid 115 surrounds a core 125 and windings 130 of the transformer 105.

The switch 100 is electrically coupled to a primary circuit 135 of the transformer 105 via wires 137 and 140. Wire 137 extends between the switch 100 and a primary winding 130*a* of the transformer 105. Wire 140 extends between the switch 100 and a bushing 145 disposed proximate the top 110*b* of the transformer tank 110. The bushing 145 is a high-voltage insulated member, which is electrically coupled to an external power source (not shown) of the transformer 105.

The switch 100 can be used to manually or automatically open or close the primary circuit 135 by selectively electrically disconnecting or connecting the wires 137 and 140. The switch 100 includes stationary contacts (not shown), each of which is electrically coupled to one or more of the wires 137 and 140. For example, the stationary contacts and wires 137 and 140 can be sonic welded together or connected via male and female quick connect terminals (not shown) or other suitable means known to a person of ordinary skill in the art having the benefit of the present disclosure, including resistance welding, arc welding, soldering, brazing, and crimping. At least one movable contact (not shown) of the switch 100 is configured to electrically engage the stationary contacts to close the primary circuit 135 and to electrically disengage the stationary contacts to open the primary circuit 135.

In certain exemplary embodiments, an operator or a motor (not shown) can rotate a handle 150 of the switch 100 to open or close the primary circuit 135. Alternatively, a trip assembly (not shown) of the switch 100 can automatically open the primary circuit 135 upon a fault condition. The trip assembly is described in more detail below, with reference to FIGS. 6-8.

In operation, a first end 100*a* of the switch 100, including the handle 150 and an upper portion of a trip housing 210 of the switch 100, is disposed outside the transformer tank 110, and a second end 100*b* of the switch 100, including the remaining portions of the trip housing 210 and the stationary and movable contacts, is disposed inside the transformer tank 110.

Figure 2:
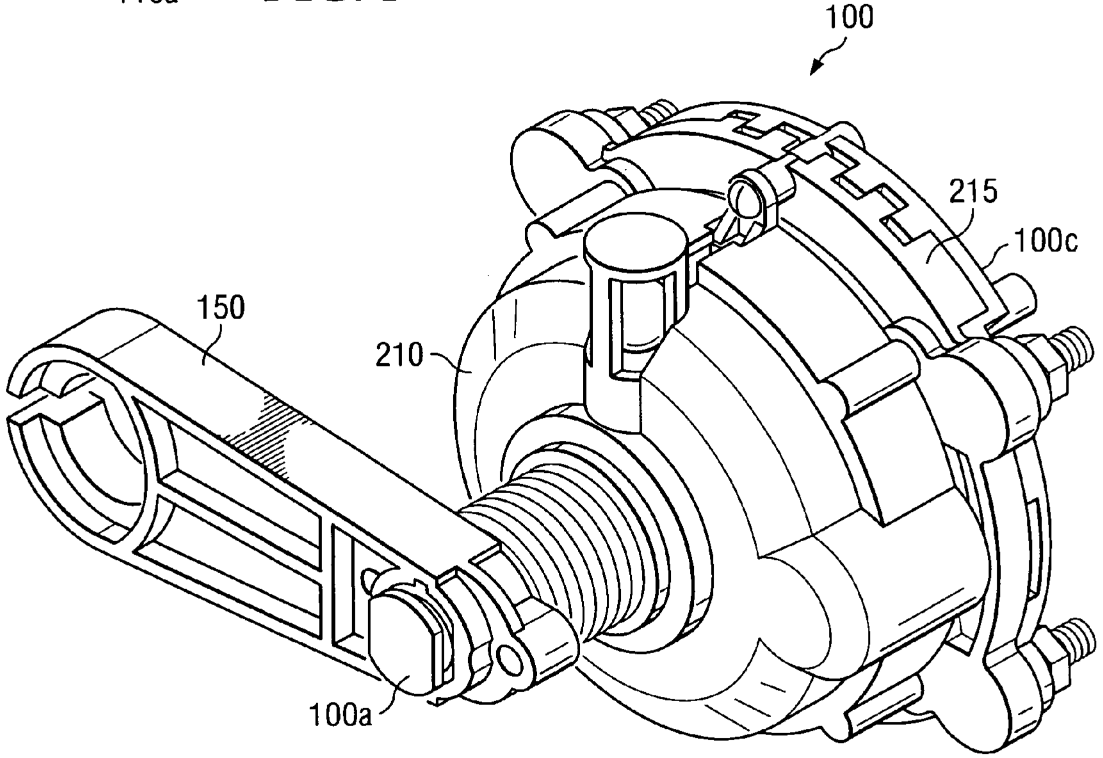
FIG. 2 is a perspective view of an exemplary fault interrupter and load break switch, in accordance with certain exemplary embodiments.
Figure 3A:
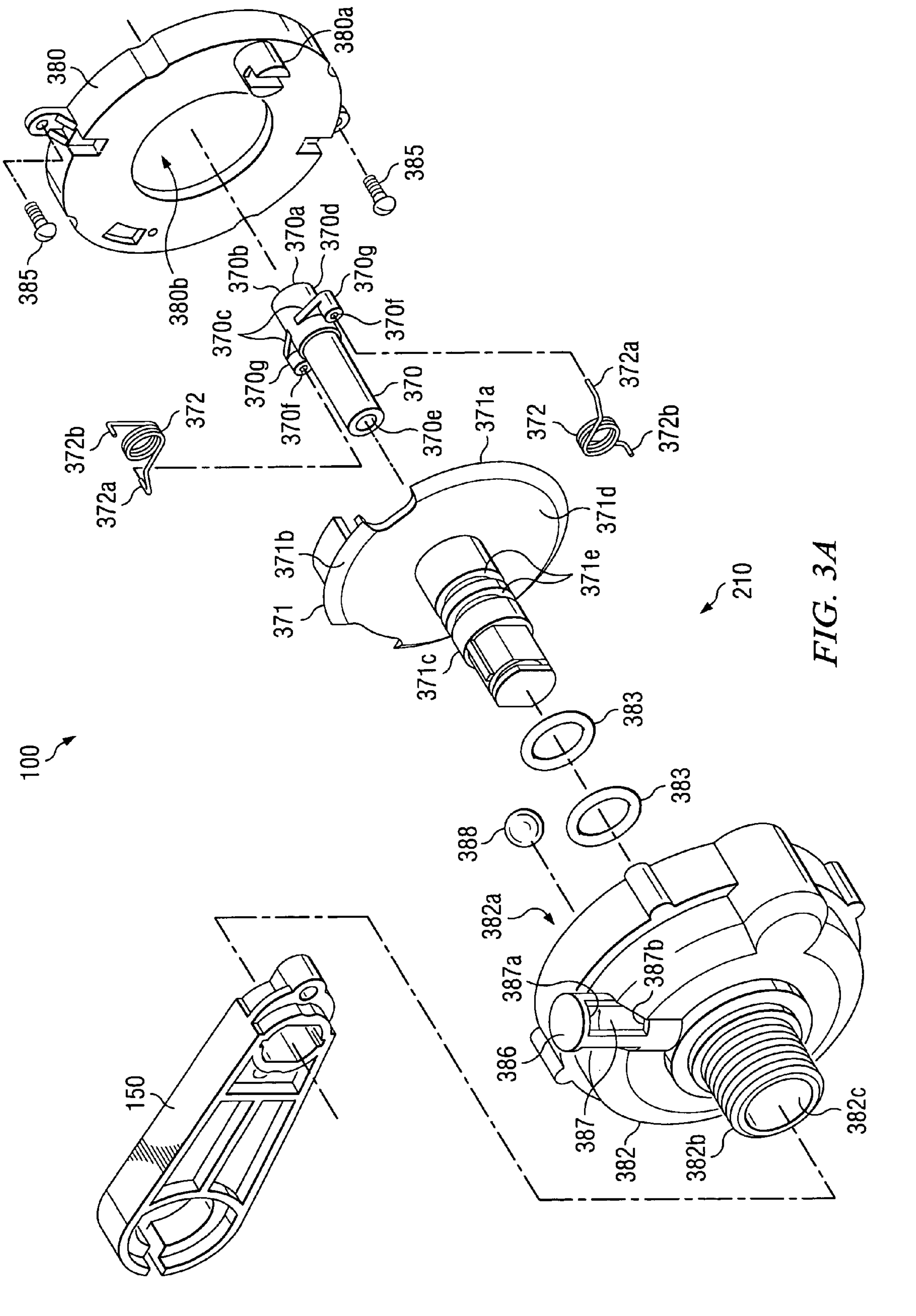
FIGS. 3A, 3B and 3C, is an exploded view of the exemplary fault interrupter and load break switch depicted in FIG. 2.
Figure 3B:
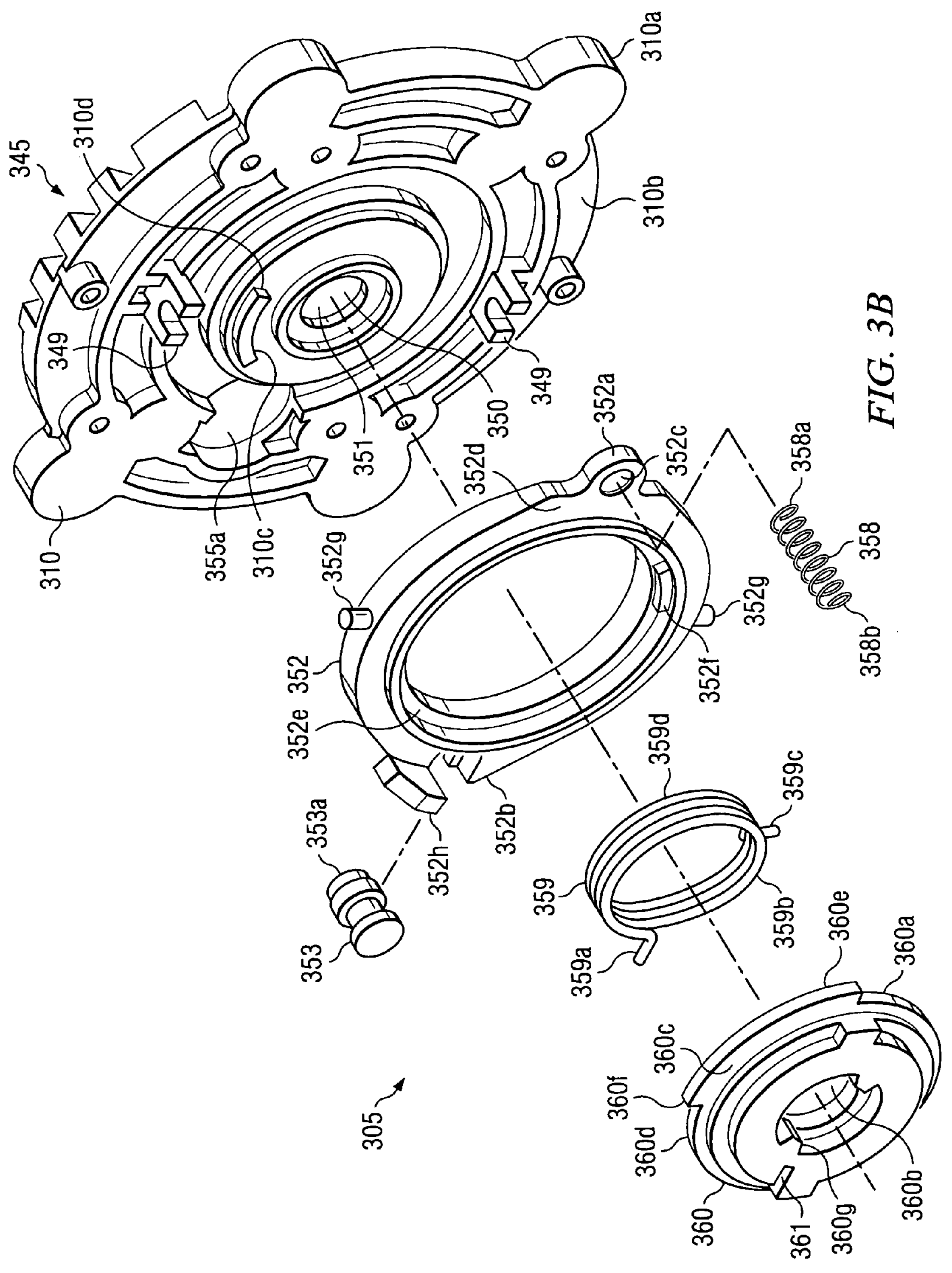
Figure 3C:
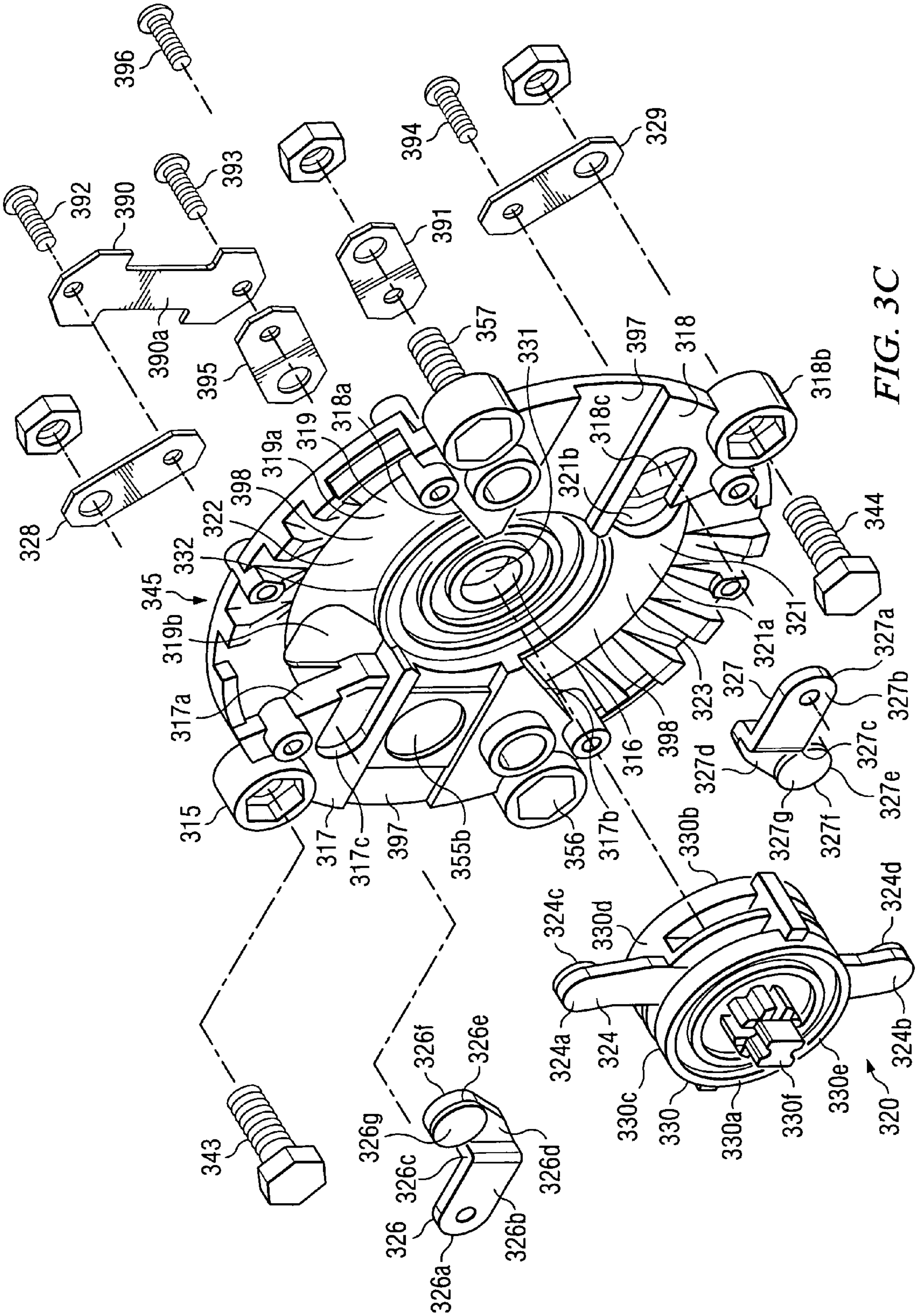

FIGS. 2 and 3 illustrate an exemplary fault interrupter and load break switch 100, in accordance with certain exemplary embodiments of the invention. The switch 100 includes a trip housing 210 coupled to an arc chamber assembly 215. A trip assembly 305 disposed between the trip housing 210 and the arc chamber assembly 215 is configured to open one or more electrical circuits associated with the arc chamber assembly, as described below.

The arc chamber assembly 215 includes a top member 310, a bottom member 315, and a rotor assembly 320 disposed between the top member 310 and the bottom member 315. The bottom member 315 includes a substantially centrally disposed aperture 316 about which arc-shaped mounting members 317 and 318 and rotation members 319 and 321 are disposed.

Interior edges 317*a* and 318*a* of the mounting members 317 and 318 and an interior surface 319*a* of the rotation member 319 define a first interior rotation region 322 of the bottom member 315. Interior edges 317*b* and 318*b* of the mounting members 317 and 318 and an interior surface 321*a* of the rotation member 321 define a second interior rotation region 323 of the bottom member 315. The interior rotation regions 322 and 323 are disposed on opposite sides of the aperture 316. Each interior rotation region 322, 323 provides an area in which ends 324*a* and 324*b* of a movable contact 324 of the rotor assembly 320 can rotate about an axis of the aperture 316, as described below.

Each of the mounting members 317 and 318 includes a recess 317*c*, 318*c* configured to receive a first end 326*a*, 327*a* of a stationary contact 326, 327. Each of the stationary contacts 326 and 327 includes an electrically conductive material. In certain exemplary embodiments, each of the stationary contacts 326 and 327 can include a contact inlay made of an electrically conductive metal alloy, such as copper-tungsten, silver-tungsten, silver-tungsten-carbide, silver-tin-oxide, or silver-cadmium-oxide. The metal alloy can have superior resistance to arc erosion and can improve the arc interruption performance of the switch 100 during fault conditions.

The contact inlay can be welded to another member made of an electrically conductive metal, such as copper. The materials selected for the contact inlay and the other member can complement and balance one another. For example, an alloy-based inlay may be complemented with a copper member because copper has better electrical conductivity than the alloy-based inlay and typically costs less. In certain exemplary embodiments, the inlay may be attached to the other member by brazing, resistance welding, percussion welding, or other suitable means known to a person of ordinary skill in the art having the benefit of the present disclosure.

Each stationary contact 326, 327 includes an elongated member 326*b*, 327*b* extending from the first end 326*a*, 327*a* of the stationary contact 326, 327 to a middle portion of the stationary contact 326, 327. The middle portion of the stationary contact 326, 327 includes a member 326*c*, 327*c* extending substantially perpendicularly from the elongated member 326*b*, 327*b* to another elongated member 326*d*, 327*d* disposed substantially parallel to the elongated member 326*b*, 327*b*. The members 326*c* and 327*c* extend proximate the interior edges 317*a* and 318*b*, respectively. Each elongated member 326*d*, 327*d* extends from the middle portion of the stationary contact 326, 327 to a circular member 326*e*, 327*e* disposed proximate a second end 326*f*, 327*f* of the stationary contact 326, 327. For example, each circular member 326*e*, 327*e* can include an inlay of the stationary contact 326, 327. The second ends 326*f* and 327*f* of the stationary contacts 326 and 327 are disposed within pockets 319*b* and 321*b*, respectively, of the first and second interior rotation regions 322 and 323. A top surface 326*g*, 327*g* of each circular member 326*e*, 327*e* is configured to engage a bottom surface 324*c*, 324*d* of each end 324*a*, 324*b* of the movable contact 324, as described below.

Each of stationary contacts 326 and 327 is configured to be electrically coupled to the primary circuit (not shown) of a transformer (not shown). For example, with reference to FIGS. 1 and 3, stationary contact 326 can be electrically coupled to wire 137 in the primary circuit 135, and stationary contact 327 can be electrically coupled to wire 140 in the primary circuit 135. In certain exemplary embodiments, each stationary contact 326, 327 can be electrically coupled to its respective wire 137, 140 via a connection member 328, 329. A first end of each connection member 328, 329 is coupled to the first end 326*a*, 327*a* of the stationary contact 326, 327 with a threaded screw 392, 394. A second end of each connection member 328, 329 is coupled to a threaded screw 343, 344 about which the wire 137, 140 can be wound.

Alternatively, stationary contact 326 can be electrically coupled to its primary circuit wire 137 via a Curie metal element 390 and a connection member 395. The Curie metal element 390 is electrically disposed between the stationary contact 326 and the connection member 395. The stationary contact 326 is connected to the Curie metal element 390 with threaded screw 392. The Curie metal element 390 is connected to one end of the connection member 395 with threaded screw 393. Another end of the connection member 395 is connected to a threaded screw 356 about which the wire 137 can be wound.

Likewise, stationary contact 327 can be electrically coupled to its primary circuit wire 140 via an isolation link (not shown) and a connection member 391. The isolation link can be electrically disposed between the stationary contact 327 and the connection member 391. The stationary contact 327 can be connected to the isolation link with a threaded screw 394. An end of the isolation link can be connected to the connection member 391 with threaded screw 396. Another end of the connection member 391 can be connected to a threaded screw 357 about which the wire 140 can be wound. Other suitable means for electrically coupling the stationary contacts 326 and 327 and the wires 137 and 140, including sonic welding, quick connect terminals or other quick connect devices, resistance welding, arc welding, soldering, brazing, and crimping, will be readily apparent to a person of ordinary skill having the benefit of the present disclosure.

The rotor assembly 320 includes an elongated member 330 having a top end 330*a*, a bottom end 330*b*, and a middle portion 330*c*. The elongated member 330 has a substantially circular cross-sectional geometry, which corresponds (on a larger scale) to the circular shape of the aperture 316. The rotor assembly 320 also includes the movable contact 324, which extends through a channel in the middle portion 330*c* of the rotor assembly 320. The channel extends between the sides 330*d* and 330*e* of the rotor assembly 320. The first and second ends 324*a* and 324*b* of the movable contact 324 extend substantially perpendicularly from the sides 330*d* and 330*e*, respectively, of the elongated member 330.

In certain exemplary embodiments, a tip of each end 324*a*, 324*b* is angled in a direction towards its corresponding stationary contact 326, 327. This angled orientation increases an arc gap between the movable contact 324 and each stationary contact 326, 327 as you move from each end 324*a*, 324*b* to its corresponding sides 330*d* and 330*e* of the rotor assembly 320. The larger arc gap at the rotor assembly 320 discourages an arc from moving inward toward the rotor assembly 320. Thus, the arc is encouraged to stay near ends 324*a* and 324*b*, along vents 345, allowing better arc interruption performance, as described hereinafter. The angled orientations of the ends 324*a* and 324*b* also increases physical distances between movable contact edges (between end 324*a* and side 330*d* and between end 324*b* and side 330*e*) and corresponding screws 357, 356. The larger physical gap can better resist dielectric breakdown between the contact 324 and the screws 357, 356 when the switch 100 is opened. A bottom surface 324*c*, 324*d* of each end 324*a*, 324*b* is configured to engage a top surface 326*g*, 327*g* of each circular member 326*e*, 327*e* of its corresponding stationary contact 326, 327, as described below.

In certain exemplary embodiments, each of the bottom surfaces 324*c* and 324*d* can include a dissimilar metal than a metal used on the top surfaces 326*g* and 327*g*. For example, the top surfaces 326*g* and 327*g* can comprise copper-tungsten, and the bottom surfaces 324*c* and 324*d* can comprise silver-tungsten-carbide. The dissimilar metals can reduce tendency of the contact surfaces 324*c*, 324*d*, 326*g*, 327*g* to weld together.

Welding has potential to occur on closing and opening of the switch 100. For example, when the switch 100 is closing and the contacts 324, 326, and 327 mate, they may bounce off of each other and open for a short time—called "contact bounce." The contact opening causes an arc to be drawn. The arc melts the contact surfaces 324*c*, 324*d*, 326*g*, 327*g*. When the contacts 324, 326, and 327 re-close, the molten metal solidifies and the contacts 324, 326, 327 are welded together.

Similarly, when the device is opening, the contact surfaces 324*c*, 324*d*, 326*g*, 327*g* slide across each other prior to finally opening. While sliding, they may bounce open (if the surfaces 324*c*, 324*d*, 326*g*, 327*g* are rough) and then re-close. Welding could occur on reclosing.

The bottom end 330*b* of the elongated member 330 includes a protrusion (not shown) configured to be disposed within a channel 331 defined by the aperture 316. The elongated member 330 is configured to rotate about an axis of the aperture 316, within the channel 331. In certain exemplary embodiments, bottom and interior edges of the bottom end 330*b* can substantially correspond to a profile of the top end 330*a* of the elongated member 330. For example, the bottom and interior edges can be configured to rotate about the axis of the aperture 316, within grooves 332 of the bottom member 315.

Movement of the elongated member 330 about the axis of the aperture 316 causes similar axial movement of the movable contact 324. That axial movement causes end 324*a* of the movable contact 324 to move relative to stationary contacts 326, within interior rotation region 322, and end 324*b* of the movable contact 324 to move relative to stationary contact 327, within interior rotation region 323. As described in more detail below, with reference to FIGS. 9-11, movement of the movable contact ends 324*a* and 324*b* relative to the stationary contacts 326 and 327 opens and closes the primary circuit of the transformer. When the movable contact ends 324*a* and 324*b* engage the stationary contacts 326 and 327, the primary circuit is closed. When the movable contact ends 324*a* and 324*b* disengage the stationary contacts 326 and 327, the primary circuit is opened.

In certain exemplary embodiments, an operator can rotate the handle 150, which is coupled to the rotor assembly 320, to move the movable contact ends 324*a* and 324*b* relative to the stationary contacts 326 and 327. The top end 330*a* of the elongated member 330 includes a substantially "H"-shaped protrusion 330*f* configured to receive a corresponding, substantially "H"-shaped notch 370*a* of a rotor pivot 370 of the trip housing 210. A person of ordinary skill in the art having the benefit of the present disclosure will recognize that, in certain alternative exemplary embodiments, many other suitable mating configurations may be used to couple the elongated member 300 with the rotor pivot 370. The rotor pivot 370 is coupled to the handle 150 via a handle pivot 371 of the trip housing 210. The rotor pivot 370 is coupled to the handle pivot 371 via torsion springs 372. Rotation of the handle 150 causes the handle pivot 371, rotor pivot 370, and rotor assembly 320 coupled thereto to rotate about the axis of the aperture 316 of the bottom member 315. Manual operation of the switch 100 is described in more detail below.

In certain alternative exemplary embodiments, a motor can be coupled to the handle 150 and/or the handle pivot 371 for automatic, remote operation of the switch. As described below, in certain exemplary embodiments, the movable contact ends 324*a* and 324*b* also can automatically be moved by the trip assembly 305 coupled to the rotor assembly 320.

The top member 310 of the arc chamber assembly 215 includes an interior profile that substantially corresponds to the interior profile of the bottom member 315. The top member 310 includes an aperture 350 disposed substantially coaxial with the aperture 316 of the bottom member 315. The aperture 350 defines a channel 351 configured to receive the substantially "H"-shaped protrusion 330*f* of the rotor assembly 320. The protrusion 330*f* is rotatable about the axis of the aperture 316, within the channel 351. A bottom surface 310*a* of the top member 310 includes grooves (not shown) within which top and interior edges in a top end 330*a* of the elongated member 330 of the rotor assembly 320 can rotate.

Each of the bottom surface 310*a* of the top member 310 and the interior surfaces 319*a* and 321*a* of the rotation members 319 and 321 of the bottom member 315 includes vents 345 configured to allow ingress and egress of dielectric fluid (not shown) for extinguishing electric arcs. As is well known in the art, separation of electrical contacts during a circuit opening operation generates an electrical arc. The arc contains metal vapor that is boiled off the surface of each electrical contact. The arc also contains gases disassociated from the dielectric fluid when it burns. The electrically charged metal-gas mixture is commonly called "plasma." Such arcing is undesirable, as it can lead to metal vapor depositing on the inside surface of the switch 100 and/or the transformer, leading to a degradation of the performance thereof. For example, the metal vapor deposits can degrade the voltage withstand ability of the switch 100.

In certain exemplary embodiments, quadrants of the arc chamber assembly 215 are configured to force arc plasma out of the switch 100. For example, two diagonal quadrants 398 can be arc chambers, and two other quadrants 397 can house other components and be "fresh" fluid reservoirs. Dielectric fluid can fill between the other components in the reservoir quadrants. When an arc is generated in the quadrants 398, it can burn the dielectric fluid in the quadrants 398 and generate arc gases. Metal vapor from the contacts 324, 326, and 327 can mix with the gas to create arc plasma.

As arc gas is generated, the internal pressure of each arc chamber increases. A path from the arc chambers back past or through the elongated member 330 to the reservoir quadrants 397 can include a labyrinth of obstructions to fluid and gas flow. Conversely, there can be little obstruction to flow toward the outside of the arc chambers through the vents 345. A pressure gradient can develop that causes flow predominantly toward the vents 345, carrying the arc plasma out to and against front edges of the vents 345.

The heat of the electric arc buns and degrades the dielectric fluid around it. The vents 345 allow the degraded dielectric fluid and arc gas resulting from the burning of the electric arc to exit the arc chamber assembly 215 and be replaced with fresh dielectric fluid from the transformer tank (not shown). Replacing degraded dielectric fluid with fresh dielectric fluid prevents arc restrikes. Restrikes are less likely to occur because fresh fluid has superior dielectric properties.

Figure 10:
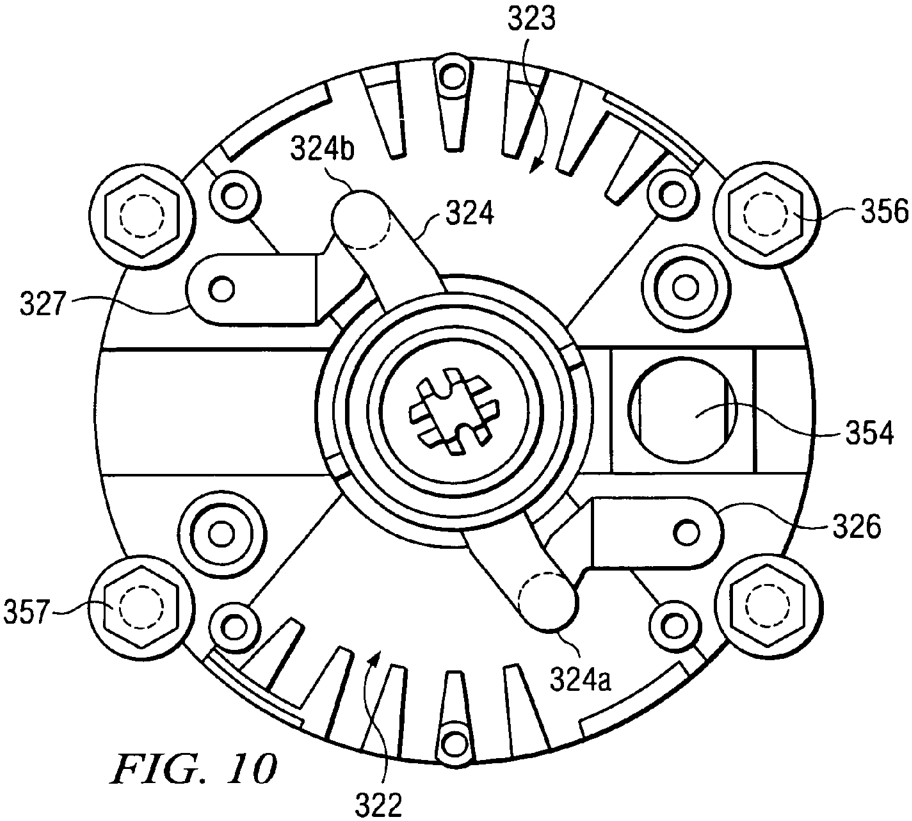
FIG. 10 is an elevational top view of stationary and movable contacts contained within interior rotation regions of a bottom member of an arc chamber assembly of an exemplary fault interrupter and load break switch in a closed position, in accordance with certain exemplary embodiments.
Figure 11:
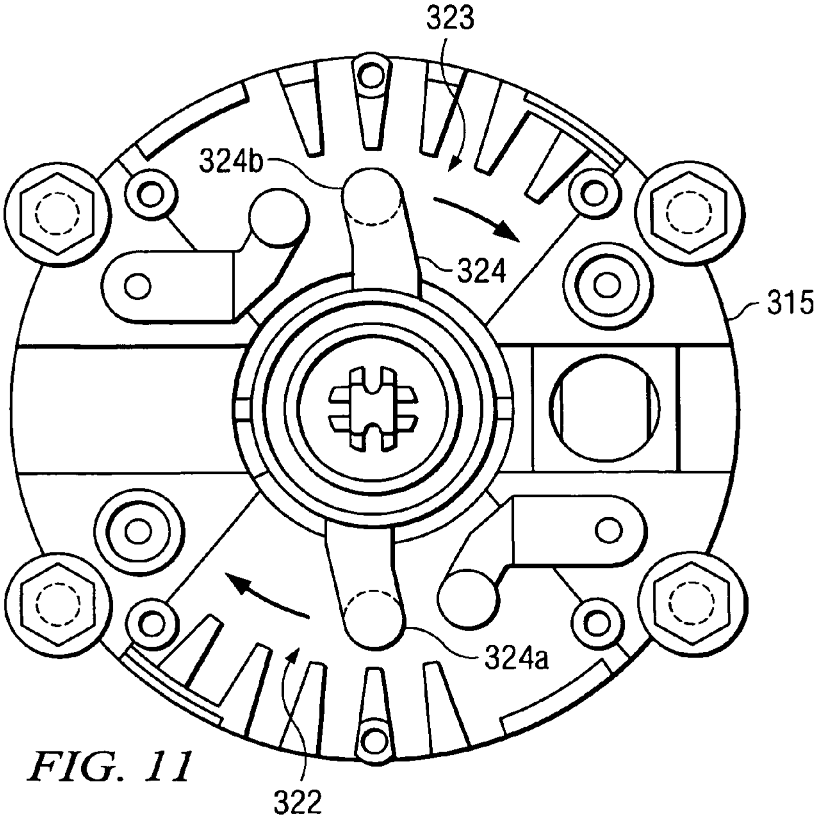
FIG. 11 is an elevational top view of stationary and movable contacts contained within interior rotation regions of a bottom member of an arc chamber assembly of an exemplary fault interrupter and load break switch moving from a closed position to an open position, in accordance with certain exemplary embodiments.

In certain exemplary embodiments, each of the stationary contacts 326 and 327 has an "L" shape (shown best in FIGS. 10-11). The "foot" of the "L" (containing the circular member 326*e*, 327*e*) can be substantially parallel with the movable contact 324. When an arc connects the open contacts 324, 326, and 327, electrical current flows through the foot, through the arc, and through the movable contact 324. The current in the foot flows in a direction opposite the current flowing in the movable contact 324. Therefore, the bend in each stationary contact 326, 327 causes the current to "turn back" on itself with respect to the direction of current flow in movable contact 324.

When electric current flows in a conductor (such as a contact), a magnetic field is generated that encircles the conductor. An analogy is a ring on a finger. The ring represents the magnetic field. The finger represents the current flowing in the conductor. Magnetic flux flows in the magnetic field around the conductor.

Figure 4:
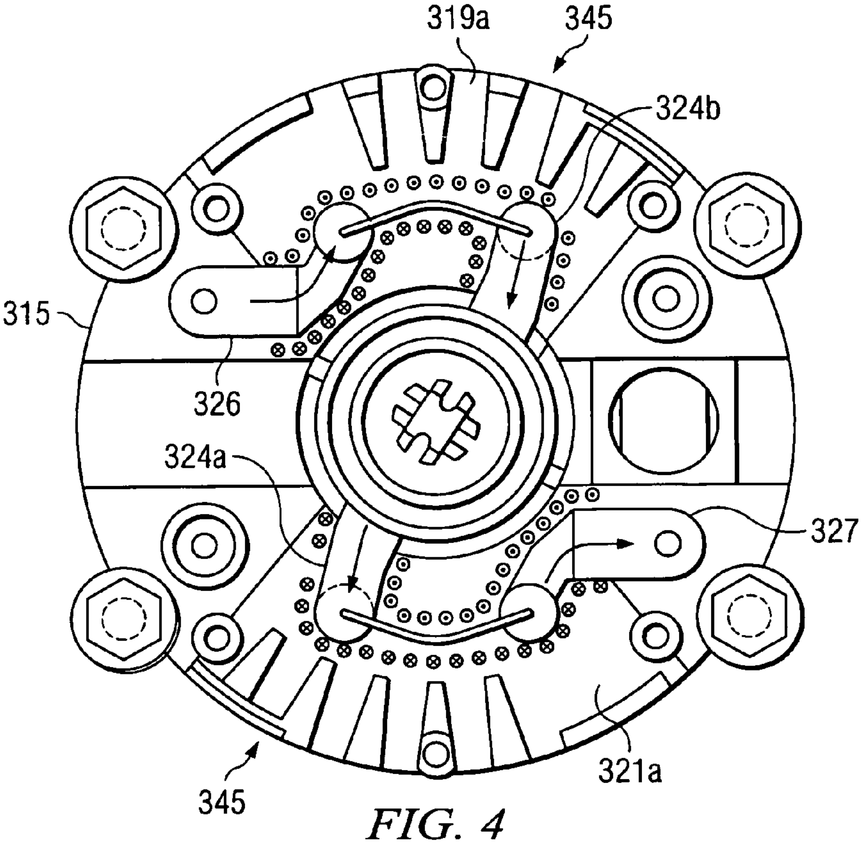
FIG. 4 illustrates magnetic flux between open contacts, and inside an arc chamber assembly, of the exemplary fault interrupter and load break switch depicted in FIG. 2, in accordance with certain exemplary embodiments.

FIG. 4 illustrates magnetic flux between open contacts 324, 326, and 327 inside the arc chamber assembly 215 (FIG. 3), in accordance with certain exemplary embodiments. In FIG. 4, the circles labeled with an "X" indicate where flux flows into surfaces 319*a* and 321*a*, and the circles labeled with dots indicate where flux flows out of the surfaces 319*a* and 321*a*, when current (I) flows in the direction shown. From dots to X's, opposing north and south magnetic poles are established. Inside a current loop created by the contacts 324, 326, and 327 and arc, all of the circles have the same label (dot or X) and therefore the same magnetic polarity.

The like polarity causes a repulsive force that is translated to and acts on the conductors that carry the current. The contacts, being solid, stiff, and substantially anchored to the arc chamber member 315, are not moved by the magnetic force. The arc plasma, however, is not solid or stationary, and thus, can be affected by the repulsive force. For example, the repulsive force can push a center area of the arc out, toward the vents 345. The repulsive force also can prevent roots of the arc from moving inward along edges of the contacts 324, 326, and 327, toward the elongated member 330.

With reference to FIG. 3, in certain exemplary embodiments, surfaces 319*a* and 321*a* are not perpendicular to an axis through aperture 316. The same may be true for like surfaces on the bottom surface 310*a* of the top member 310. When members 310 and 315 are coupled together, a distance between these interior surfaces can be larger towards the centers of the members 310 and 315, proximate the elongated member 330, than towards the outer edges of the members 310 and 315, proximate the vents 345. These differences in distances create a "sloped" geometry in the arc chamber assembly 215. This sloped geometry can cause an arc to be squeezed as it is moved out toward the vents 345. The arc prefers to have a round cross sectional shape, as that shape helps to minimize resistance in the arc column and, therefore, minimizes arc voltage generated across the arc. By squeezing the arc into an oblong cross sectional shape, arc voltage is increased, helping to extinguish the arc.

In certain exemplary embodiments, the vents 345 can be designed in smooth up and down transitions and without perpendicular walls or other obstructions to the flow of dielectric fluid to prevent the arc from echoing off of a perpendicular tank wall and rebounding back into the arc chamber assembly 215. The vents 345 also can be sized and shaped to prevent the arc from traveling outside the arc chamber assembly 215 and striking the tank wall or other internal transformer components. In certain exemplary embodiments, walls that form the vents can be substantially "V" shaped with the wider end of the V being towards the outside edge of the arc chamber assembly 215. This shape can direct individual jets of arc gasses away from each other. The purpose of this directional flow is to prevent mingling of the gas jets into an arc plasma bubble outside of the arc chamber assembly 215. If a plasma bubble forms outside the device, the arc could strike, burn, and short out to other transformer components and prolong the fault condition.

A top surface 310*b* of the top member 310 is coupled to the trip assembly 305, which is configured to automatically open the primary circuit upon a fault condition. Cradles 349 extending substantially perpendicular from the top surface 310*b* are configured to receive protrusions 352*g* extending from a rocker 352 of the trip assembly 305. The protrusions 352*g* rest within the cradles 349, suspending the rocker 352 proximate the top surface 310*b*. A magnet 353 rests within a cradle 352*h* of the rocker 352 and extends through apertures 355*a* and 355*b* of the top member 310 and the bottom member 315, respectively, of the arc chamber assembly 215.

A bottom surface 353*a* of the magnet 353 is configured to engage a top surface 390*a* of a Curie metal element 390 coupled to the bottom member 310 via screws 392 and 393. The Curie metal element 390 is electrically coupled to the stationary contact 326 via the connection member 328. The Curie metal element 390 also is electrically coupled to a threaded screw 356 about which at least one wire of an electrical circuit may be wound. For example, the wire 340 (FIG. 1) of the primary circuit of the transformer may be wound about the threaded screw 356. Thus, electrical current from the wire 340 to the stationary contact 326 passes through the Curie metal element 390.

The Curie metal element 390 includes a material, which loses its magnetic properties when it is heated beyond a predetermined temperature, i.e., a Curie transition temperature. In certain exemplary embodiments, the Curie transition temperature is approximately 140 degrees Celsius. For example, the Curie metal element 390 may be heated to the Curie transition temperature during a high current surge through the Curie metal element 390 or from a high voltage in the circuit or hot dielectric fluid conditions in the transformer. One exemplary cause of a high current surge through the Curie metal element 390 is a fault condition in the transformer.

When the Curie metal element 390 has a temperature at or below the Curie transition temperature, the magnet 353 is magnetically attracted to the Curie metal element 390, thereby magnetically latching the bottom surface 353*a* of the magnet to the top surface 390*a* of the Curie metal element 390. When the Curie metal element 390 has a temperature higher than the Curie transition temperature, the magnetic latch between the Curie metal element 390 and the magnet 353 is released. This release is referred to herein as a "trip." When the magnetic latch is tripped, the trip assembly 305 causes the circuit electrically coupled to the Curie metal element 390 to open.

Specifically, the trip causes a return spring 358 coupled to the rocker 352 of the trip assembly 305 to actuate an end 352*a* of the rocker 352 coupled to the return spring 358 towards the top surface 310*b* of the top member 310. The return spring 358 also actuates another end 352*b* of the rocker 352 comprising the magnet 353 away from the top surface 310*b* of the top member 310. Thus, the rocker 352 rotates along an axis defined by the cradles 349 of the top member 310.

In certain alternative exemplary embodiments, a solenoid (not shown) can be used instead of the magnet 353 to actuate the rocker 352. The solenoid can be operated through electronic controls (not shown). The electronic controls may provide greater flexibility in trip parameters such as trip times, trip currents, trip temperatures, and reset times. The electronic controls also may provide for remote trips and resets.

The return spring 358 is a coil spring having a first end 358*a* and a second end 358*b*. The first end 358*a* is disposed within a pocket 352*c* in a top surface 352*d* of the rocker 352. The second end 358*b* of the return spring 358 is disposed within a pocket 380*a* of a bottom member 380 of the trip housing 210.

The return spring 358 exerts a spring force against the end 352*a* of the rocker 352 in the direction of the top member 310. The spring force is less than a magnetic force between the magnet 353 and the Curie metal element 390, when the magnet 353 and the Curie metal element 390 are magnetically latched. The magnetic force is a force against the end 352*b* of the rocker 352 in the direction of the top member 310. Thus, when the magnet 353 and Curie metal element 390 are magnetically latched, the net of the spring force and the magnetic force is a force that maintains the end 352*a* away from the top member 310 and the end 352*b* towards the top member 310. When the magnetic latch between the magnet 353 and the Curie metal element 390 is released, the spring force is greater than the magnetic force, causing the end 352*a* to move towards the top member 310 and the end 352*b* to move away from the top member 310.

This rotation causes a trip spring 359 coupled to the rocker 352 via a trip rotor 360 to rotate the trip rotor 360 about the axis of the aperture 350 of the top member 310. The trip spring 359 is a coil spring having a first tip 359*a* extending proximate a top end 359*b* of the trip spring 359 and a second tip 359*c* extending proximate a bottom end 359*d* of the trip spring 359. The first tip 359*a* interfaces with a notch 361 of the trip rotor 360. The second tip 359*c* interfaces with a protrusion 310*c* extending substantially perpendicular from the top surface 310*b* of the top member 310.

The bottom end 359*d* of the trip spring 359 rests on the top surface 310*b* of the top member 310, substantially about the aperture 350. The top end 359*b* of the trip spring 359 is biased against a bottom surface 360*a* of the trip rotor 360, substantially about an aperture 360*b* thereof. Thus, the trip spring 359 is essentially sandwiched between the trip rotor 360 and the top member 310.

The trip rotor 360 includes a protrusion 360*c* extending substantially perpendicular from a side edge 360*d* of the trip rotor 360. When the magnet 353 and Curie metal element 390 are magnetically latched, a bottom surface 360*e* of the protrusion 360*c* engages a surface 352*e* of the rocker 352, with an edge 360*f* of the protrusion 360*c* engaging a protrusion 352*f* extending from the surface 352*e* of the rocker 352. The first tip 359*a* of the trip spring 359 interfaces with the notch 361 of the trip rotor 360. The second tip 359*b* of the trip spring 359 interfaces with a side edge 310*d* of the protrusion 310*c* of the top member 310. The trip spring 359 exerts a spring force on the trip rotor 360, in a clockwise direction about the aperture 350. This force is counteracted by a mechanical force exerted by the protrusion 352*f* of the rocker 352, in the opposite direction.

When the magnetic latch between the magnet 353 and the Curie metal element 390 is released, the protrusion 352*f* of the rocker 352 moves away from the edge 360*f* of the trip rotor 360, releasing the mechanical force from the protrusion 352*f* of the rocker 352. The spring force from the trip spring 359 causes the trip rotor 360 to rotate about the aperture 350, in a clockwise direction. This movement causes the rotor assembly 320 coupled to the trip rotor 360 to rotate, in a clockwise direction, about the aperture 316, as described below. When the rotor assembly 320 rotates about the aperture 316, the ends 324*a* and 324*b* of the movable contact 324 move away from the stationary contacts 326 and 327, respectively, thereby opening the electrical circuit coupled to the stationary contacts 326 and 327.

The aperture 360*b* of the trip rotor 360 is substantially co-axial with the apertures 350 and 316 of the top member 310 and the bottom member 315, respectively, of the first arc chamber assembly 315. Each of the top end 330*a* of the elongated member 300 of the rotor assembly 320 and a bottom end 370*b* of the rotor pivot 370 of the trip housing 210 extends part-way through the aperture 360*b* of the trip rotor 360. The "H"-shaped protrusion 330*f* of the elongated member 330 engages the corresponding, substantially "H"-shaped notch 370*a* of the rotor pivot 370 within the aperture 360*b*.

The bottom end 370*b* of the rotor pivot 370 includes protrusions 370*c*, which engage corresponding protrusions 360*g* of the trip rotor 360. The protrusions 370*c* and 360*g* extend substantially perpendicularly from edges 370*d* and 360*h*, respectively of the rotor pivot 370 and the trip rotor 360, within the aperture 360. With this arrangement, rotation of the trip rotor 360 about the axis of the aperture 350 causes similar rotation of the rotor pivot 370 and the rotor assembly 320 coupled thereto.

A top end 370*e* of the rotor pivot 370 is disposed within a channel 371*a* of the handle pivot 371 of the trip housing 210. The channel 371*a* is substantially co-axial with the apertures 360*b*, 350, and 316 of the trip rotor 360, the top member 310, and the bottom member 315, respectively, as well as an aperture 380*b* of the bottom member 380 of the trip housing 210. The handle pivot 371 includes a substantially circular base member 371*b* and an elongated member 371*c* extending substantially perpendicular from an upper surface 371*d* of the base member 371*b*. The member 371*c* is disposed substantially about the axis of the channel 371*a*, surrounding the top end 370*e* of the rotor pivot 370 extending therein.

Spring contact members 370*g* extending substantially perpendicular from the edge 370*d* of the rotor pivot 370, proximate the protrusions 370*c*, are coupled to a bottom surface 371*b* of the handle pivot 371 via springs 372. Each spring 372 is a coil spring having a first tip 372*a* disposed within a channel 370*f* of one of the spring contact members 370*g* and a second tip 372*b* disposed within a channel (not shown) in the bottom surface 371*b* of the handle pivot 371.

The springs 372 are configured to exert spring forces on the rotor pivot 370 for rotating the rotor pivot 370 (and the rotor assembly 320 and the trip rotor 360) about the axis of the channel 371*a* during a manual operation of the switch 100. Actuation of a handle 150 coupled to the elongated member 371*c* of the handle pivot 371 exerts a rotational force on the handle pivot 371, which transfers the rotational force to the rotor pivot 370 and the rotor assembly 320 and trip rotor 360 coupled thereto. The primary function of the springs 372 is to minimize arcing between the stationary contacts 326 and 327 and the ends 324*a* and 324*b* of the movable contact 324 in the arc chamber assembly 215 by very rapidly driving the movable contact 324 into its open or closed positions.

Both the handle pivot 371 and the bottom member 380 are disposed substantially within an interior cavity 382*a* of a top member 382 of the trip housing 210. The top member 382 has a substantially circular cross-sectional geometry and includes an elongated member 382*b* defining a channel 382*c* through which the elongated member 371*c* of the handle pivot 371 extends. Two o-rings 383 disposed about grooves 371*e* of the elongated member 371*c*, within the channel 382*c* of the top member 382, are configured to maintain a mechanical seal between the trip housing 210 and the handle pivot 371.

A set of screws (not shown) attach the top member 382 to the arc chamber assembly 215. Another set of screws 385 attach the bottom member 380 to the arc chamber assembly 215. The handle pivot 371 is essentially sandwiched between the top member 382 and the bottom member 380.

In certain exemplary embodiments, the top member 382 of the trip housing 210 includes a low oil lockout apparatus 386. The low oil lockout apparatus 386 includes a vented channel 387 within which a float member 388 is disposed. The float member 388 is responsive to changes in dielectric fluid level in the transformer. Specifically, the dielectric fluid level in the transformer determines the position of the float member 388 relative to the vented channel 387.

In operation, a first end 100*a* of the switch 100, including the handle 150 and the elongated member 382 of the trip housing 210 of the switch 100, is disposed outside the transformer tank, and a second end 100*c* of the switch 100, including the remainder of the trip housing 210 and the arc chamber assembly 215, is disposed inside the transformer tank. The vented channel 387 extends upward within the transformer tank. The height of the dielectric fluid level relative to the vented channel 387 determines the height of the float member 388 relative to the vented channel 387. For example, when the dielectric fluid level is above the vented channel 387, the float member 388 is disposed proximate a top end 387*a* of the vented channel 387. When the dielectric fluid level is below the vented channel 387 in the tank, the float member 388 is disposed proximate a bottom end 387*b* of the vented channel 387.

Disposition of the float member 388 proximate the bottom end 387*b* of the vented channel 387 locks the handle pivot 371 of the trip housing 215 (and the rotor pivot 370 and rotor assembly 320 coupled thereto) in a fixed position. The float member 388 blocks rotation of the handle pivot 371 within the interior cavity 382*a* of the top member 382 of the trip housing 210. Thus, the float member 388 prevents the switch 100 from opening and closing the primary circuit of the transformer unless a sufficient amount of dielectric fluid surrounds the stationary and movable contacts 326-327 and 324 of the switch 100.

Figure 5:
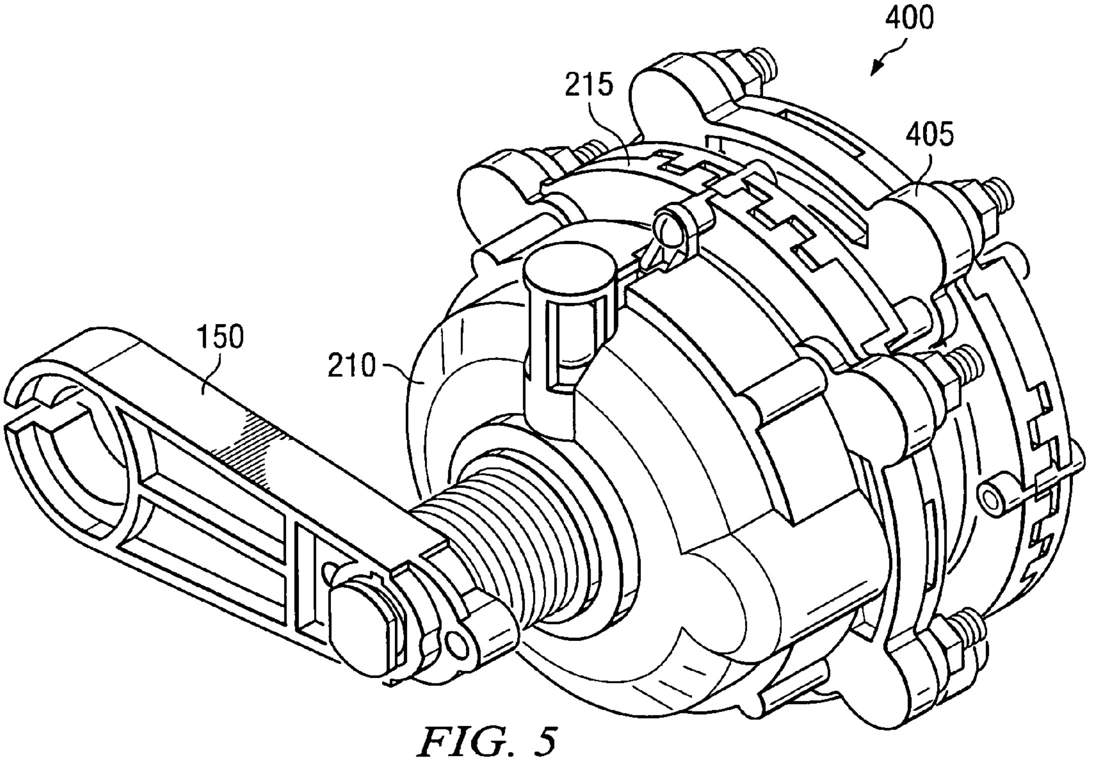
FIG. 5 is a perspective view of an exemplary fault interrupter and load break switch, in accordance with certain alternative exemplary embodiments.
Figure 6:
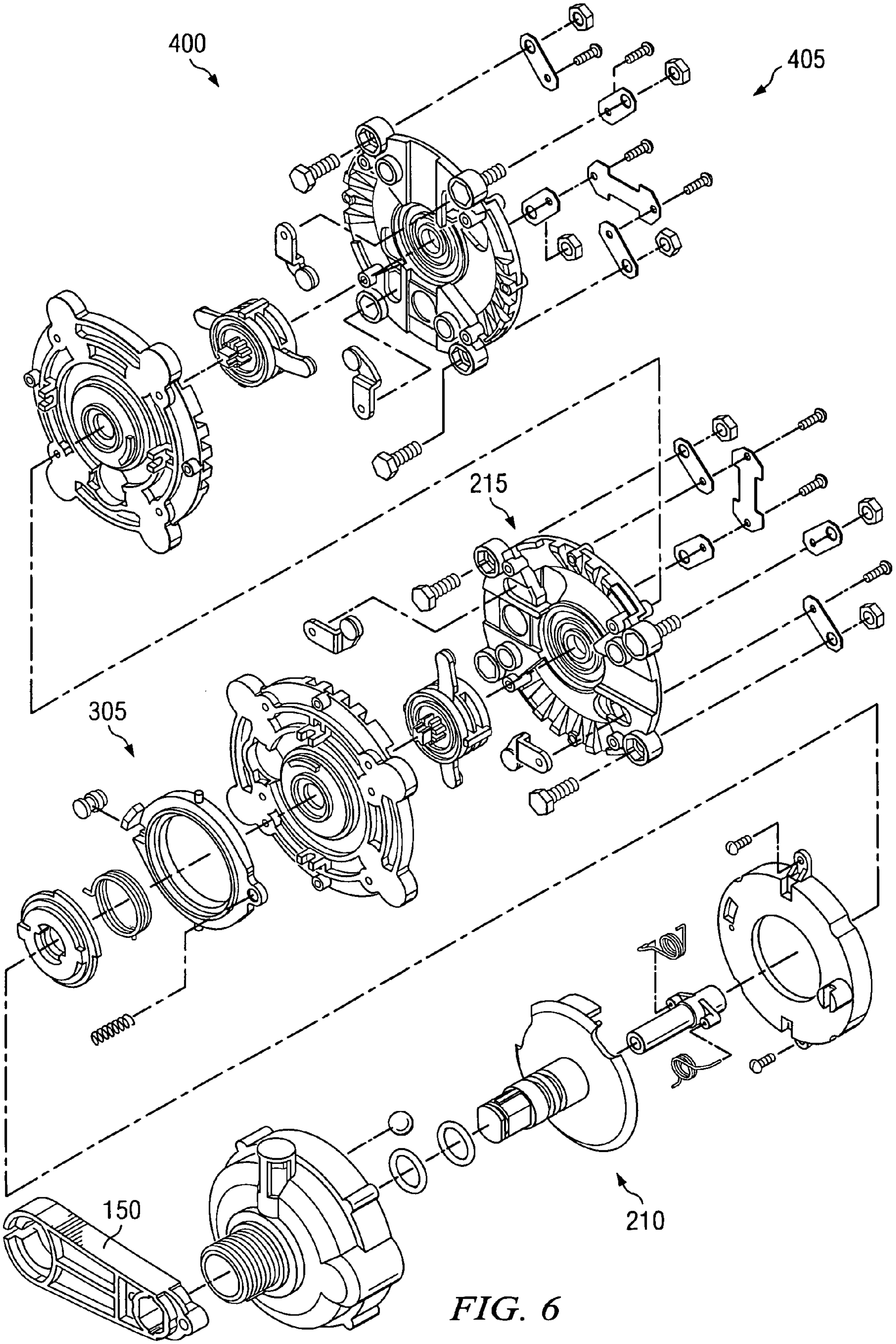
FIG. 6 is an exploded view of the exemplary fault interrupter and load break switch depicted in FIG. 5.

FIGS. 5 and 6 illustrate an exemplary fault interrupter and load break switch 400, in accordance with certain alternative exemplary embodiments of the invention. The switch 400 is identical to the switch 100 described above with reference to FIGS. 2 and 3, except that the switch 400 includes two arc chamber assemblies—a first arc chamber assembly 215 and a second arc chamber assembly 405. The trip assembly 305 disposed between the trip housing 210 and the first arc chamber assembly 215 is configured to open one or more electrical circuits associated with the first arc chamber assembly 215 and/or the second arc chamber assembly 405.

The second arc chamber assembly 405 is substantially identical to the first arc chamber assembly 215. The second arc chamber assembly 405 is coupled to the first arc chamber assembly 215 via screws (not shown), which threadably extend through the first arc chamber assembly 215, the second arc chamber assembly 405, and at least a portion of the top member 382 of the trip housing 210. The elongated member 330 of the rotor assembly 320 of the first arc chamber assembly 215 includes a substantially "H"-shaped notch (not shown) within the bottom end 330*b* thereof. The substantially "H"-shaped notch of the elongated member 330 is configured to receive a corresponding, substantially "H"-shaped protrusion 430*f* of a rotor assembly 420 of the second arc chamber assembly 215. A person of ordinary skill in the art having the benefit of the present disclosure will recognize that, in certain alternative exemplary embodiments, many other suitable mating configurations may be used to couple the elongated member 430 of rotor assembly 420 with the rotor assembly 320.

This arrangement allows the rotor assembly 420 to rotate substantially co-axially with the rotor assembly 320 of the first arc chamber assembly 215. Thus, an opening or closing operation, which rotates the rotor assembly 320 of the first arc chamber assembly 215, will rotate the rotor assembly 420 of the second arc chamber assembly 405.

The second arc chamber assembly 405 may be used for two phase assemblies of the switch 400. The second arc chamber assembly 405 also may be wired in series with the first arc chamber assembly 215 to increase the voltage capacity of the switch 400. For example, if a single arc chamber assembly 215 can interrupt 15,000 volts at 2,000 amps AC, then a combination of two arc chamber assemblies 215 and 405 may interrupt 30,000 volts at 2,000 amps AC. This increased voltage capacity is due to the fact that the two arc chamber assemblies 215 and 405 break the circuit in 4 different places.

With reference to FIGS. 1-6, when the arc chamber assemblies 215 and 405 are connected in parallel, electric current can flow from the bushing 145 to the threaded screw 357 of the first arc chamber 215 via the primary circuit wire 140. The threaded screw 357 can be electrically connected to threaded screw 344 of the first arc chamber 215 via the isolation link of the first arc chamber 215. When the contacts 324, 326, and 327 are engaged, electric current can flow from the threaded screw 344 to the threaded screw 343, through the contacts 324, 326, and 327. Similarly, electric current can flow from the threaded screw 343, through the Curie metal element 390, to the threaded screw 356. The primary circuit wire 137 can electrically connect the threaded screw 356 to the windings 130 of the transformer 105. Similar electrical connections can exist between another bushing (not shown) of the transformer 105 and the second arc chamber assembly 405, and between the second arc chamber assembly 405 and the windings 130. Thus, in certain exemplary parallel connections of the arc chamber assemblies 215 and 405, the arc chamber assemblies 215 and 405 are not directly connected to one another.

When the arc chamber assemblies 215 and 405 are connected in series, electric current can flow from the bushing 145, through one of the arc chamber assemblies 215 and 405, through the other arc chamber assembly 215, 400, and to the windings 130. A connecting wire (not shown) can connect the arc chamber assemblies 215 and 405. For example, the electric current can flow from the bushing 145 to a threaded screw 357 of the first arc chamber assembly 215, 405, and from the threaded screw 357 through an isolation link, contacts 324, 326, and 327, and a threaded screw 343 of the first arc chamber assembly 215, 405. The connecting wire can connect the threaded screw 343 to a threaded screw 356 of the second arc chamber assembly 215, 405. Electric current can flow from the threaded screw 356 of the second arc chamber assembly 405, 215, through a Curie metal element 390, threaded screw 343, contacts 324, 326, and 327, and threaded screw 344 of the second arc chamber assembly 214, 400. The electric current can flow from the threaded screw 344 to the windings 130. For example, a wire 137 can connect the threaded screw 344 to the windings.

In certain alternative exemplary embodiments, more than two arc chamber assemblies may be provided for increased phases and voltage capacity. For example, the switch 100 can include three arc chamber assemblies, wherein each arc chamber assembly is electrically coupled to a different phase of three-phase power. Similar to the in-parallel configuration discussed above, each of the arc chamber assemblies can be connected to a different bushing and to its corresponding phase of the transformer.

Figure 7:
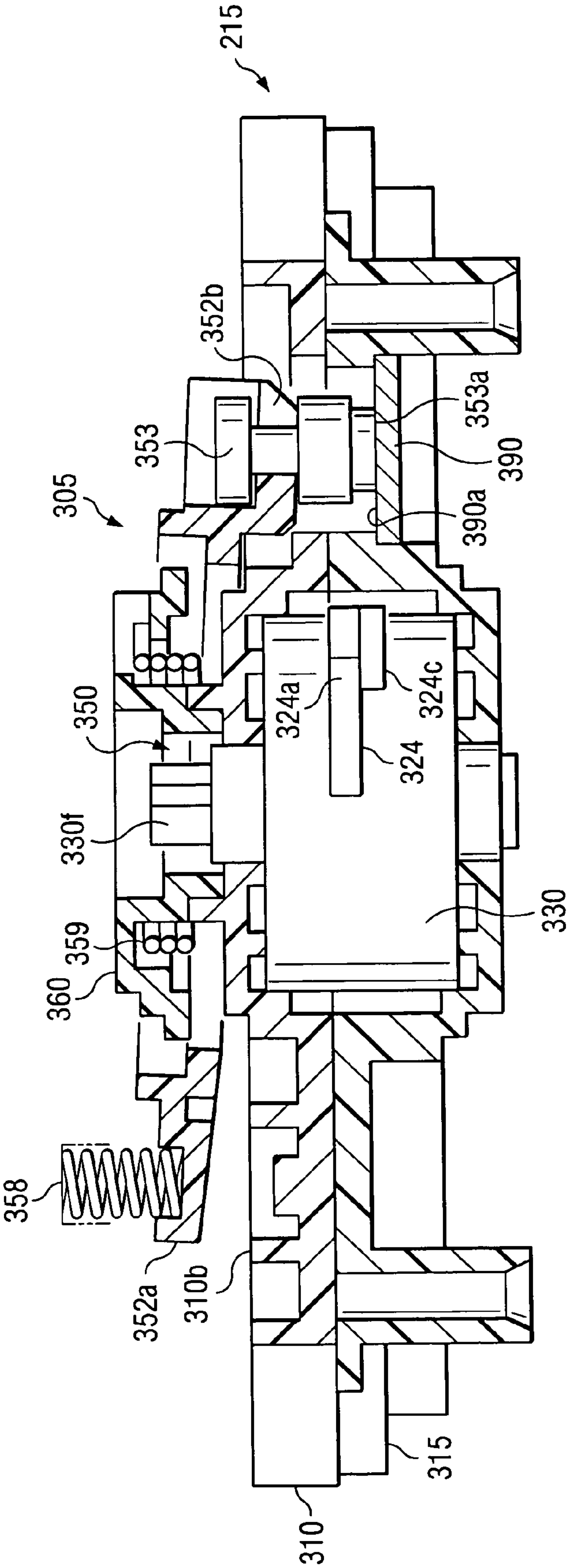
FIG. 7 is an elevational cross-sectional side view of an arc chamber assembly and trip assembly of an exemplary fault interrupter and load break switch in a closed position, in accordance with certain exemplary embodiments.
Figure 8:
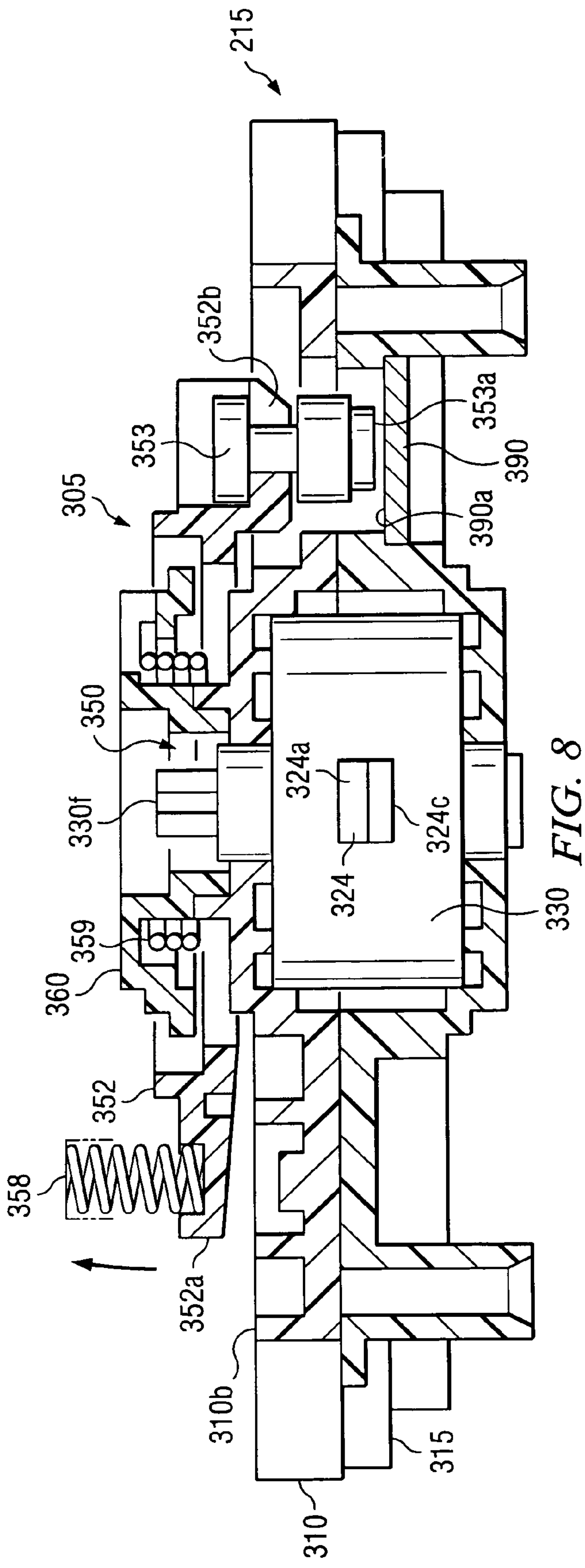
FIG. 8 is an elevational cross-sectional side view of an arc chamber assembly and trip assembly of an exemplary fault interrupter and load break switch moving from a closed position to an open position, in accordance with certain exemplary embodiments.
Figure 9:
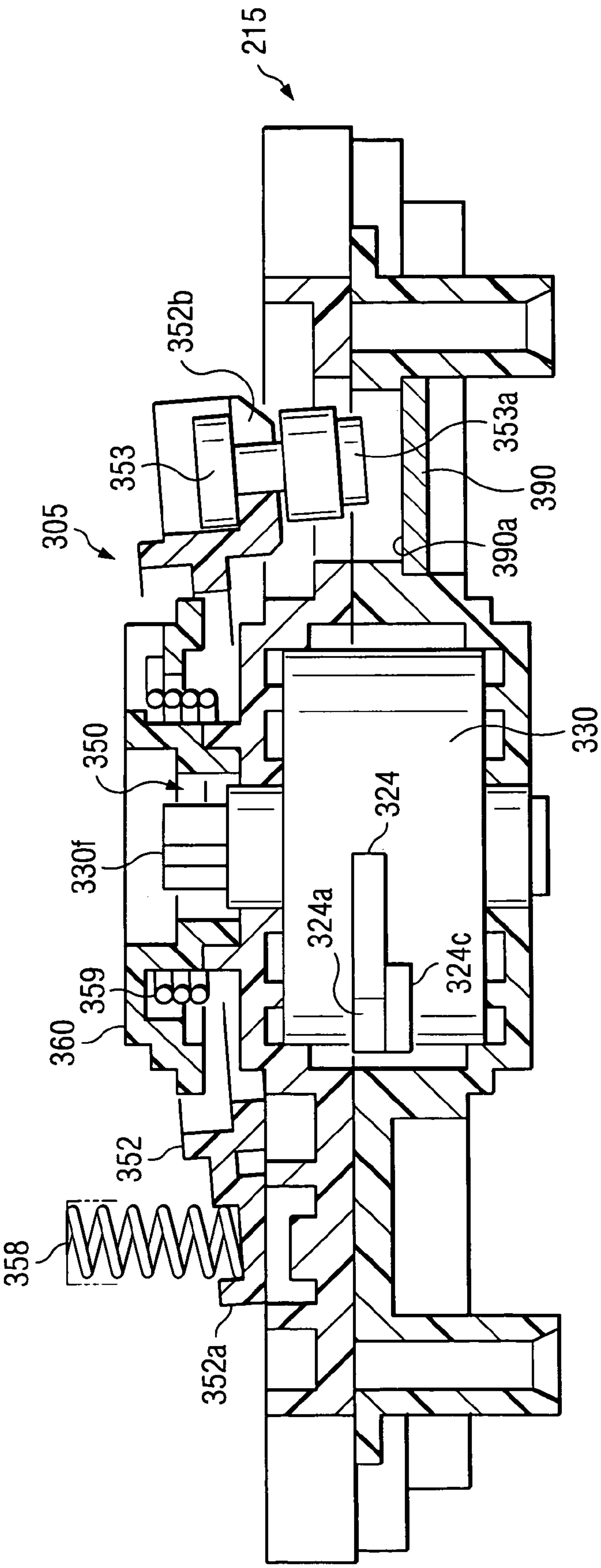
FIG. 9 is an elevational cross-sectional side view of an arc chamber assembly and trip assembly of an exemplary fault interrupter and load break switch in an open position, in accordance with certain exemplary embodiments.

FIGS. 7-9 are elevational cross-sectional side views of an arc chamber assembly 215 and trip assembly 305 of the exemplary fault interrupter and load break switch 100, which is moved from a closed position, as shown in FIG. 7, to an intermediate position, as shown in FIG. 8, to an open position, as shown in FIG. 9, in accordance with certain exemplary embodiments. Such operation will be described with reference to the switch 100 depicted in FIG. 3.

In the closed position, the Curie metal element 390 of the arc chamber assembly 215 has a temperature at or below the Curie transition temperature. Thus, the Curie metal element 390 is magnetic. The top surface 390*a* of the Curie metal element 390 magnetically engages the bottom surface 353*a* of the magnet 353. This engagement exerts a force against the end 352*b* of the rocker 352 of the trip assembly 305 in the direction of the Curie metal element 390. This force is greater than a spring force being exerted by the return spring 358 against the end 352*a* of the rocker 352 in the direction toward the top member 310.

In the closed position, the ends 324*a* and 324*b* of the movable contact 324 of the rotor assembly 320 engage stationary contacts (not shown in FIGS. 7-9) disposed within the bottom member 315 of the arc chamber assembly 215. An electrical circuit (not shown) coupled to the stationary contacts is closed. Current in the circuit flows from one of the stationary contacts, through the end 324*a* of the movable contact 324 to the end 324*b* (not shown in FIGS. 7-9) of the movable contact 324, to the other of the stationary contacts.

When the Curie metal element 390 is heated to a temperature above the Curie transition temperature, the magnetic permeability of the Curie metal element 390 is reduced. For example, the Curie metal element 390 may be heated to such a temperature during a high current surge through the Curie metal element 390 or from hot dielectric fluid conditions in the transformer. One exemplary cause of a high current surge through the Curie metal element 390 is a fault condition in the transformer (not shown) coupled to the switch.

When the magnetic permeability of the Curie metal element 390 is reduced, the magnetic latch between the Curie metal element 390 and the magnet 353 is tripped, causing the circuit coupled to the stationary contacts to open. Specifically, as the magnetic permeability of the Curie metal element 390 is reduced, the magnetic force between the magnet 353 and the Curie metal element 390 becomes less than the force exerted by the return spring 358. Thus, the trip causes the return spring 358 coupled to the rocker 352 to actuate the end 352*a* of the rocker 352 coupled to the return spring 358 towards the top surface 310*b* of the top member 310. The return spring 358 also actuates another end 352*b* of the rocker 352 comprising the magnet 353 away from the Curie metal element 390.

This actuation causes the rocker 352 to move away from an edge 360*f* (FIG. 3) of the trip rotor 360, releasing a mechanical force between the rocker 352 and the trip rotor 360. A spring force from the trip spring 359 of the trip assembly 305 causes the trip rotor 360 to rotate about the aperture 350 of the top member 310 of the arc chamber assembly 215, in a clockwise direction. This movement causes the rotor assembly 320 coupled to the trip rotor 360 to rotate, in a clockwise direction, about the axis of the aperture 350. When the rotor assembly 320 rotates about the axis of the aperture 350, the ends 324*a* and 324*b* of the movable contact 324 move away from the stationary contacts 326 and 327, thereby opening the electrical circuit coupled to the stationary contacts 326 and 327.

Figure 12:
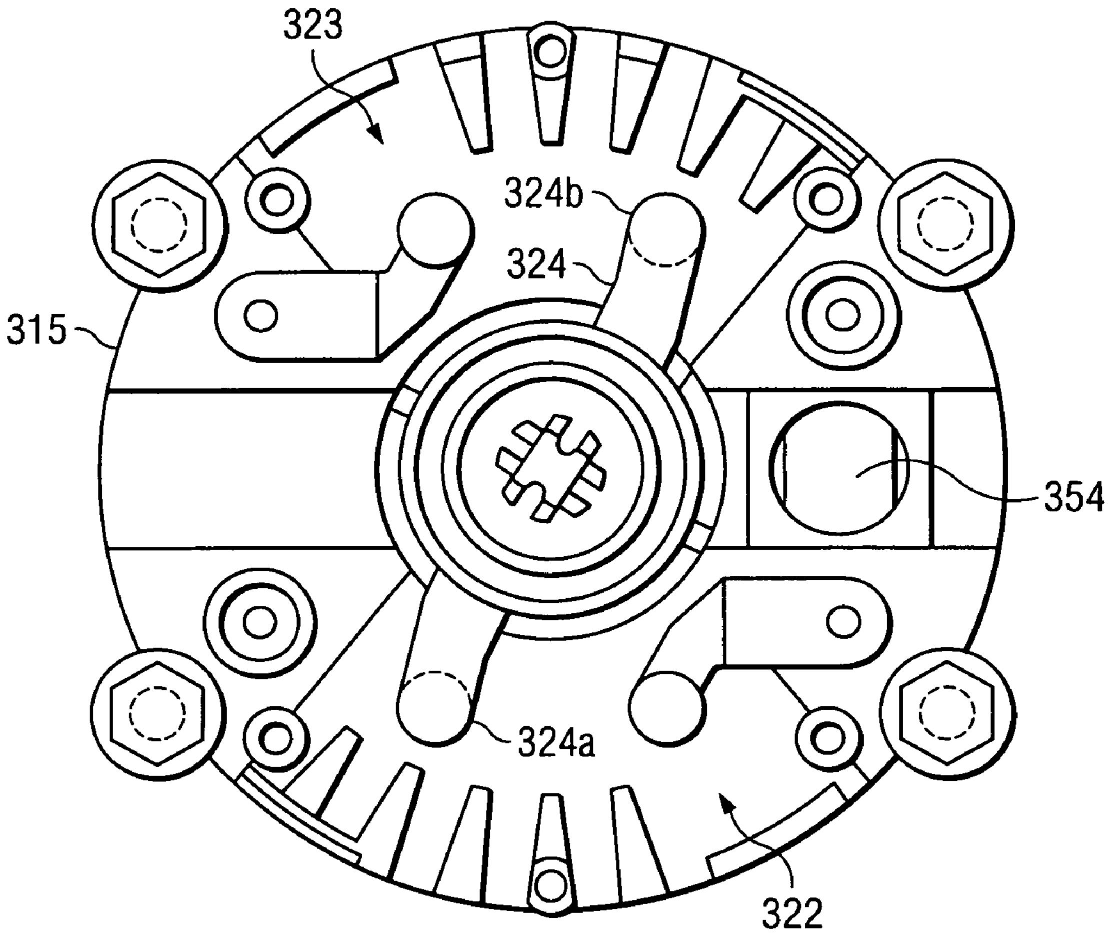
FIG. 12 is an elevational top view of stationary and movable contacts contained within interior rotation regions of a bottom member of an arc chamber assembly of an exemplary fault interrupter and load break switch in an open position, in accordance with certain exemplary embodiments.
Figure 13:
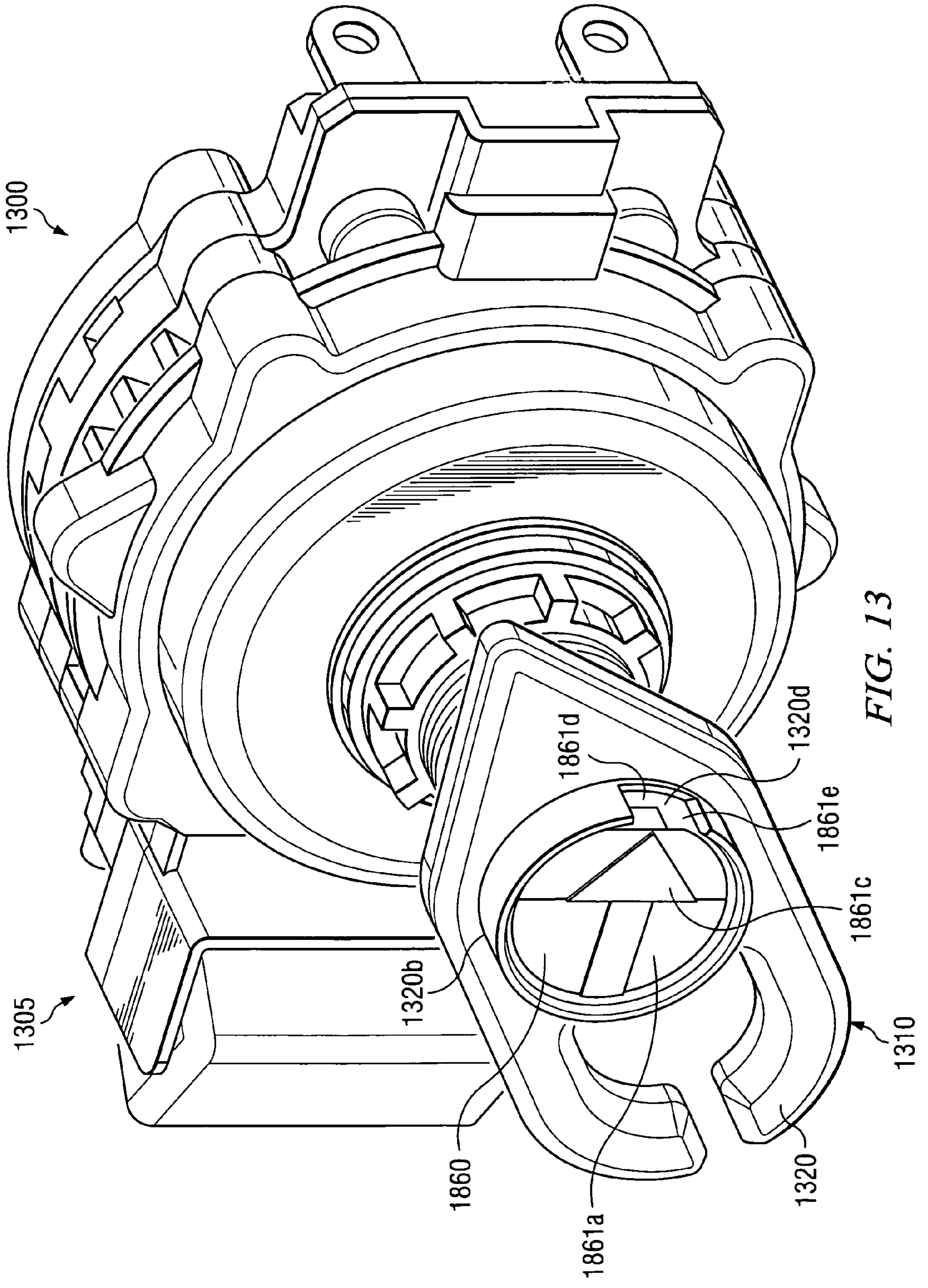
FIG. 13 is a perspective view of an exemplary fault interrupter and load break switch, in accordance with certain alternative exemplary embodiments.
Figure 14:
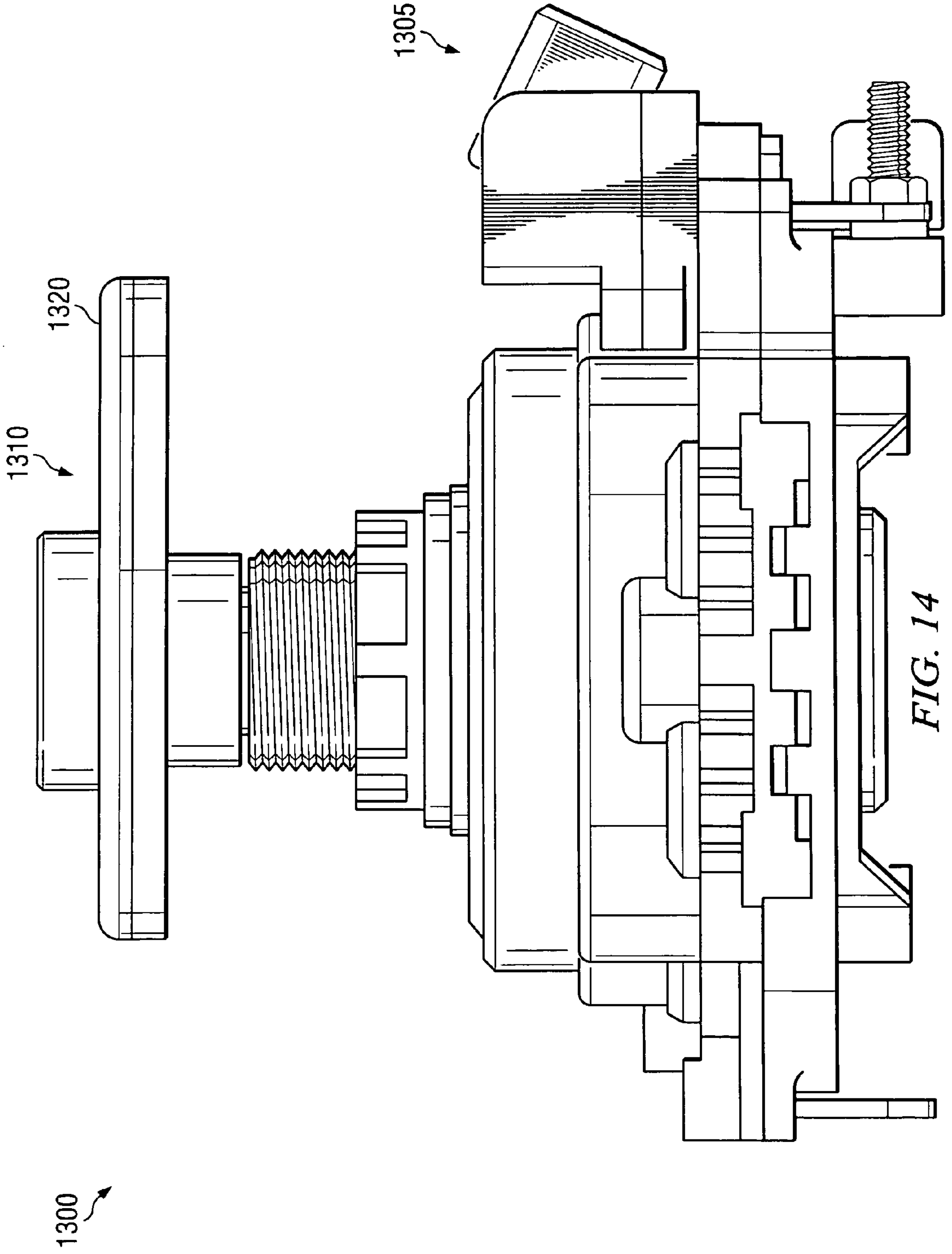
FIG. 14 is an elevational side view of the exemplary fault interrupter and load break switch depicted in FIG. 13, in accordance with certain exemplary embodiments.

FIGS. 10-12 are elevational top views of stationary contacts 326-327 and a movable contact 324 contained within interior rotation regions 322 and 323 of the bottom member 315 of the arc chamber assembly 215 of the exemplary fault interrupter and load break switch 100 moving from a closed position, as shown in FIG. 10, to an intermediate position, as shown in FIG. 11, to an open position, as shown in FIG. 12, in accordance with certain exemplary embodiments. Such operation will be described with reference to the switch 100 depicted in FIG. 3.

In the closed position, end 324*a* of the movable contact 324 engages stationary contact 326 within the interior rotation region 322, and end 324*b* of the movable contact 324 engages stationary contact 327 within the interior rotation region 323. A circuit (not shown) coupled to the stationary contacts 326 and 327 is closed. For example, current in the circuit may flow from a wire (not shown) wound about screw 356, through the Curie metal element 390 to the stationary contact 326, through the end 324*a* of the movable contact 324 to the end 324*b* of the movable contact 324, through the stationary contact 327 to a wire (not shown) wound about screw 357.

In the intermediate position, illustrated in FIG. 11, the ends 324*a* and 324*b* of the movable contact 324 move away from the stationary contacts 326 and 327, respectively, thereby beginning the opening of the circuit. End 324*a* rotates within the interior rotation region 322. End 324*b* rotates within the interior rotation region 323.

In the fully open position, illustrated in FIG. 12, the ends 324*a* and 324*b* of the movable contact 324 are completely disengaged from the stationary contacts 326 and 327, respectively. The circuit coupled to the stationary contacts 326 and 327 is opened, as current cannot flow between the disengaged movable contact 324 and stationary contacts 326 and 327. The circuit is opened in two places—the junction between end 324*a* and stationary contact 326 and the junction between end 324*b* and stationary contact 327.

This "double break" of the circuit increases the total arc length of the electric arc generated during the circuit opening. An arc having an increased arc length has an increased arc voltage, making the arc easier to extinguish. The increased arc length also helps to prevent arc restrikes.

In a switch closing operation, the ends 324*a* and 324*b* rotate within the interior rotation regions 322 and 323, respectively, until they engage stationary contacts 326 and 327, respectively. The ends 324*a* and 324*b* and the stationary contacts 326 and 327 are designed to minimize bounce on contact closing. With reference to FIG. 3, each stationary contact 326, 327 includes an angled ramp surface 326*g*, 327*g* on which the end 324*a*, 324*b* slides during the closing operation. The ramp angle allows each movable contact end 324*a*, 324*b* to move up approximately 0.20 inches and compress a movable contact spring (not shown) disposed between the ends 324*a* and 324*b*, within the elongated member 330 of the rotor assembly 320, to a proper contact force. The ramp angle also allows for lower friction during contact opening operations.

In certain exemplary embodiments, the ramp angle can be small enough that, when the switch 100 is closed, each movable contact end 324*a*, 324*b* does not slide down its corresponding ramp, but also large enough to allow the contact ends 324*a* and 324*b* to slide down their corresponding ramps with minimal pressure during a switch opening operation. This can reduce the force required to open the switch 100 and also can allow the switch 100 to include multiple arc chamber assemblies 215 without requiring greater forces to overcome the friction associated with traditional pinch contact structures.

FIGS. 13-19 illustrate an exemplary fault interrupter and load break switch 1300, in accordance with certain alternative exemplary embodiments. The switch 1300 will be described with reference to FIGS. 13-19. The switch 1300 is substantially similar to the switch 100 described above, except that the switch 1300 includes a low oil trip assembly 1305 in place of the low oil lockout apparatus 386 and a sensor element 1315 (see FIG. 15*c*) in place of the Curie metal element 390. In addition, the switch 1300 includes an indicator assembly 1310 and an adjustable rating functionality that are not present in the switch 100.

The low oil trip assembly 1305 is similar to the low oil lockout apparatus 386 of the switch 100, except that, in addition to, or in place of, the lockout functionality of the low oil lockout apparatus 386, the low oil trip assembly 1305 is configured to cause an electrical circuit associated with the switch 1300 to open when a dielectric fluid level in the transformer falls below a minimum level. In other words, the low oil trip assembly 1305 is configured to automatically trip the switch 1300 to an "off" position when the dielectric fluid level falls below the minimum level.

Figure 15A:
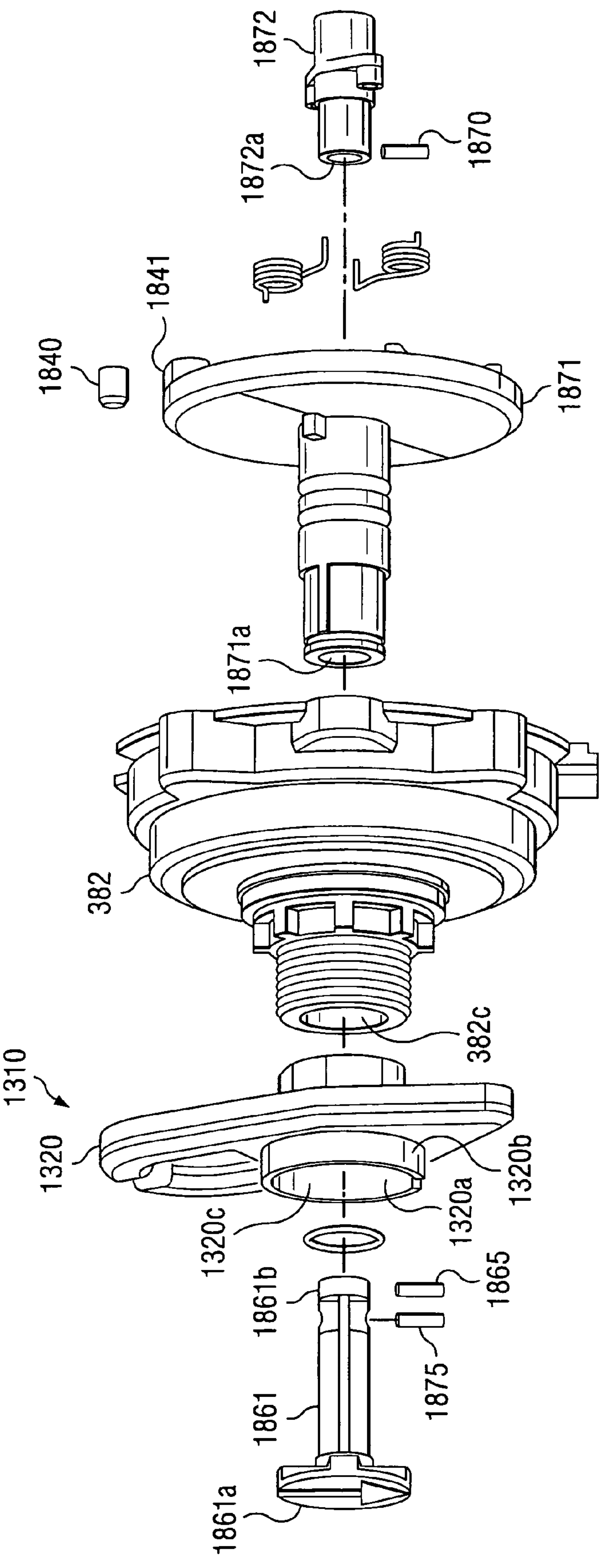
FIGS. 15A and 15B, is an exploded view of the exemplary fault interrupter and load break switch depicted in FIG. 13, in accordance with certain exemplary embodiments.
Figure 15B:
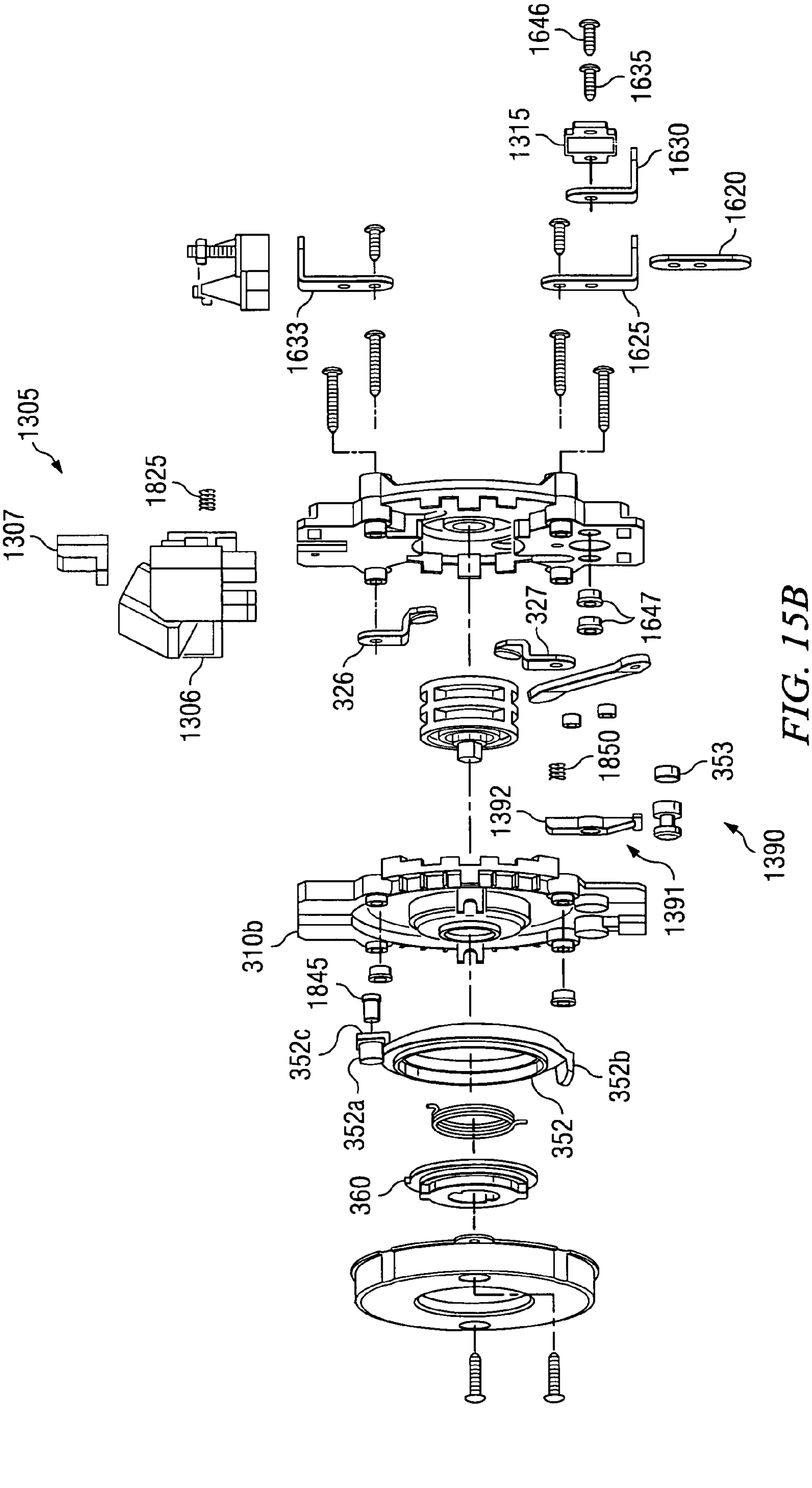
Figure 18:
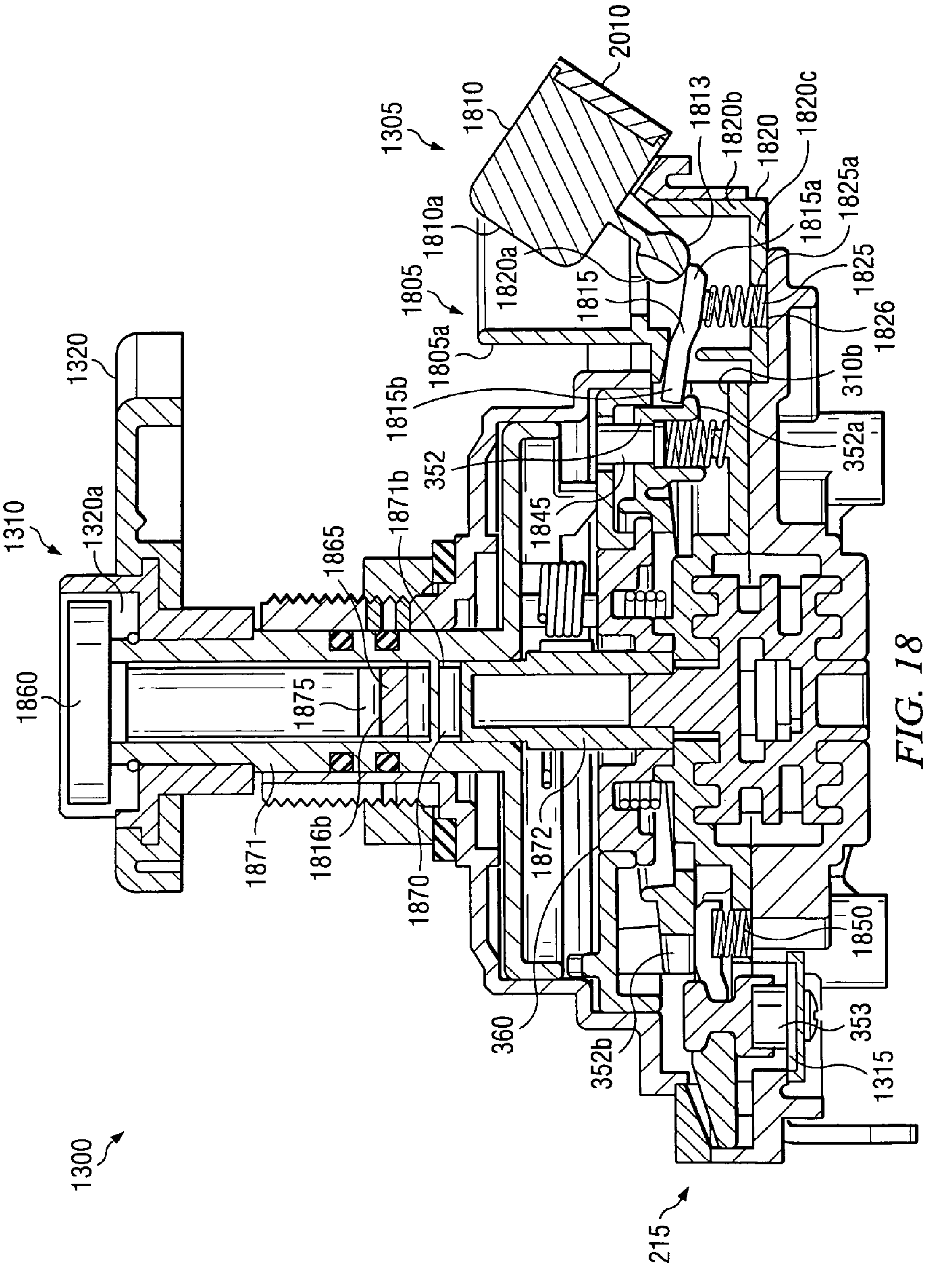
FIG. 18 is a cross-sectional side view of the exemplary fault interrupter and load break switch depicted in FIG. 13, in an operating position, in accordance with certain exemplary embodiments.
Figure 19:
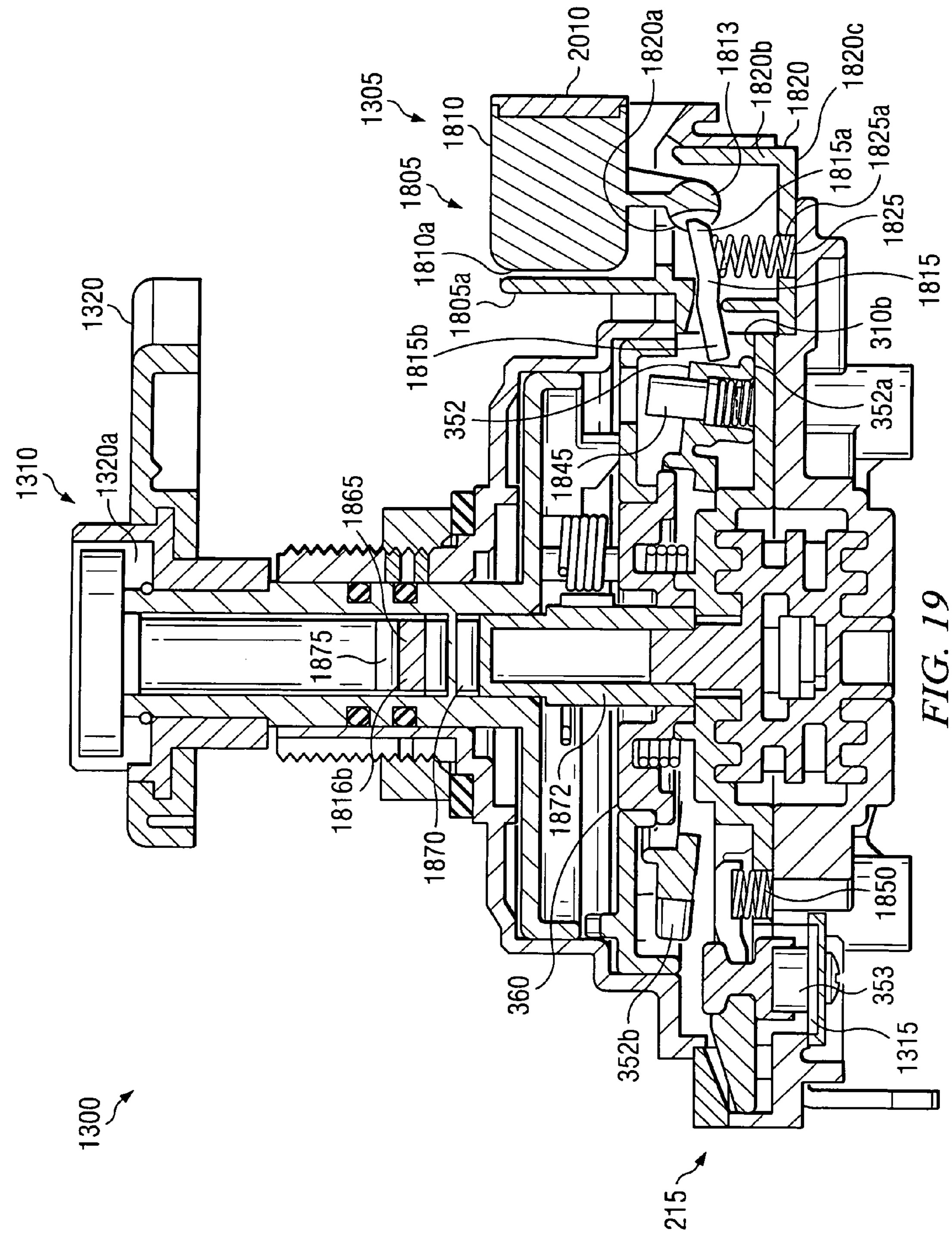
FIG. 19 is a cross-sectional side view of the exemplary fault interrupter and load break switch depicted in FIG. 13, in a tripped position caused by a low dielectric fluid level condition, in accordance with certain exemplary embodiments.

As best seen on FIGS. 15, 18, and 19, the low oil trip assembly 1305 includes a float assembly 1306 and a spring 1825. The float assembly 1306 includes a frame 1805 within which a float member 1810 is at least partially disposed. The float member 1810 includes a material that is configured to be responsive to changes in the dielectric fluid level in the transformer. Specifically, the float member 1810 includes a material that is configured to float in the dielectric fluid such that the dielectric fluid level in the transformer can determine the position of the float member 1810 relative to the frame 1805. The float member 1810 has a weight sufficient to overcome friction to trip the switch 1300 in low dielectric fluid level conditions, as described hereinafter.

For example, when the dielectric fluid level is above a minimum level, a gap can exist between a bottom end 1810*a* of the float member 1810 and a base member 1805*a* of the frame 1805, substantially as illustrated in FIG. 18. In this position, a cam 1813 of the float member 1810 engages a lever 1815 of the assembly 1305, within a float cage 1820. The cam 1813 rests on a pivot member 1820*a* of the float cage 1820. The spring 1825 exerts a spring force against an end 1815*a* of the lever 1815, in a direction of the pivot member 1820*a* of the float cage 1820. The cam 1813 of the float member 1810 prevents the end 1815*a* of the lever 1815 from engaging the pivot member 1820*a* and from moving past the cam 1813.

When the dielectric fluid level recedes below the minimum level, the weight of the float member 1810 causes the float member 1810 to rotate relative to the pivot member 1820*a* of the float cage 1820, with the bottom end 1810*a* of the float member 1810 moving towards the base portion 1805*a* of the frame 1805 and the cam 1813 moving towards a side member 1820*b* of the float cage 1820 and away from the lever 1815. This movement allows the spring force of the spring 1825 to actuate the end 1815*a* of the lever 1815 towards the pivot member 1820*a* of the float cage 1820 and past the cam 1813.

As the end 1815*a* moves towards the pivot member 1820*a* of the float cage 1820, another, opposite end 1815*b* of the lever 1815 moves in the opposite direction, towards a top member 310 of an arc chamber assembly 1390 of the switch 1300. This movement causes the end 1815*b* of the lever 1815 to actuate an end 352*a* of a rocker 352 of the switch 1300 towards a top surface 310*b* of the top member 310. This actuation of the rocker 352 can release a trip rotor 360 to thereby open an electrical circuit associated with the switch 1300, substantially as described above in connection with the switch 100. FIG. 19 illustrates the switch 1300 after completion of a low oil trip operation, in accordance with certain exemplary embodiments.

To reset the switch 1305, and thus to re-close the electrical circuit, an operator can turn a handle 1320 of the switch 1300 to actuate the end 352*a* of the rocker 352 back, in a direction away from the top surface 310*b* of the arc chamber assembly 1390. This movement can cause the end 1815*b* of the lever 1815 to similarly move in a direction away from the top surface 310*b* of the arc chamber assembly 1390. The opposite end 1815*a* of the lever 1815 can move in an opposite direction, away from the pivot member 1820*a* of the float cage 1820. In moving away from the pivot member 1820*a*, the end 1815*a* of the lever 1815 can at least partially compress the spring 1825 and move away from the cam 1813.

If sufficient dielectric fluid is present in the transformer, the float member 1810 can rotate relative to the pivot member 1820*a* of the float cage 1820, with the bottom end 1810*a* of the float member 1810 moving in a direction away from the base portion 1805*a* of the frame 1805 and the cam 1813 moving in a direction away from the side member 1820*b* of the float cage 1820. For example, the cam 1813 can lodge itself substantially between the pivot member 1820*a* of the float cage 1820 and the end 1815*a* of the lever, as illustrated in FIG. 18. If sufficient dielectric fluid does not exist in the transformer, the switch 1300 may not be reset because the spring 1825 will continue to actuate the lever 1815.

In certain exemplary embodiments, the low oil trip assembly 1305 may be configured to be selectively attached to, and removed from, the switch 1300. To accommodate an application where low oil trip functionality is desired, the operator can install the low oil trip assembly 1305 in the switch 1300. For example, the operator can install the low oil trip assembly 1305 by inserting the spring 1825 in a hole 1826 in a bottom member 1820*c* of the float cage 1820 and snapping together one or more notches and/or protrusions in the float assembly 1306 and the arc chamber assembly 1390. A bottom end 1825*a* of the spring 1825 can rest on the top surface 310*b* of the arc chamber assembly 1390.

To accommodate an application where low oil trip functionality is not desired, an operator can remove the low oil trip assembly 1305 from the switch 1300. For example, the operator can remove the low oil trip assembly 1305 by pulling apart the float assembly 1306 and the arc chamber assembly 1390. Once removed, the operator can install and operate the switch 1300 as is, or the operator can replace the low oil trip assembly 1305 with a barrier element 1307 (FIG. 15) or other device.

Figure 20:
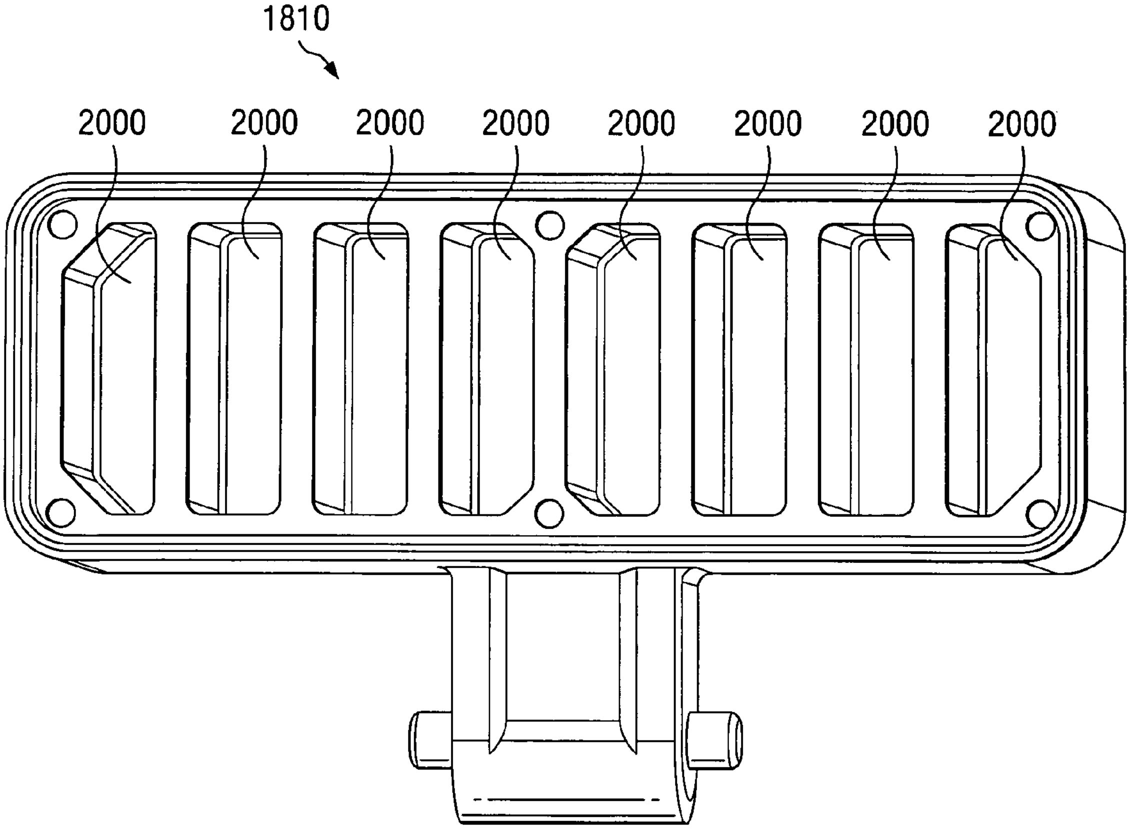
FIG. 20 is a perspective view of an exemplary sensor element and sensor element cover of the exemplary fault interrupter and load break switch depicted in FIG. 13, in accordance with certain exemplary embodiments.

FIG. 20 is an elevational view of the float member 1810, in accordance with certain exemplary embodiments. The float member 1810 includes an elongated member 2010 acting as a lid for multiple chambers 2000. Each of the chambers 2000 is configured to house air or another gas or fluid. For example, the air or other gas or fluid can be buoyant, providing or enhancing the ability of the float member 1810 to float in the dielectric fluid.

In certain exemplary embodiments, a double seal can separately seal each chamber 2000 and the elongated member 2010. For example, the elongated member 2010, and each chamber 2000 therein, can be separately sonically welded shut. In other words, the elongated member can be sonically welded around a perimeter of each chamber 2000 and also around a perimeter of the float 1810. Such a seal can prevent failure of the float member 1810 by preventing dielectric fluid from flooding the chambers 2000. For example, separately sealing each chamber 2000 can prevent flooding in one chamber 2000 from spreading to other chambers 2000.

The indicator assembly 1310 includes an indicator 1861 having a front face 1861*a* and a bottom end 1861*b*. As best seen on FIG. 13, the front face 1861 includes a label 1861*c* indicating a current operating state of the switch 1300. For example, the label 1861*c* can include an arrow, the direction of which indicates whether the switch 1300 is "on" or "off." The front face 1861*a* of the indicator 1861 is substantially disposed within a framed annular recess 1320*a* of the handle 1320. The annular recess 1320*a* and its corresponding frame 1320*b* are disposed substantially about a channel 1320*c* (FIG. 15*a*) of the handle 1320.

The bottom end 1861*b* of the indicator 1861 extends through channels 1320*c*, 382*c*, and 1871*a* of the handle 1320, a top member 382 of the switch 1300, and a handle pivot 1871 of the switch 1300, respectively. A magnet 1865 extends through the bottom end 1861*b* of the indicator 1861, substantially perpendicular to an axis thereof. When the switch 1300 is assembled, the bottom end 1861*b* of the indicator 1861 is disposed proximate an end 1872*a* of a rotor pivot 1872. A segment 1871*b* (FIG. 18) of the handle pivot 1871 is disposed between the bottom end 1861*b* of the indicator 1861 and the end 1872*a* of the rotor pivot 1872. For example, the segment

1871*b* can prevent dielectric fluid from leaking from within the transformer tank to the outside of the transformer tank.

The rotor pivot 1872 is identical to the rotor pivot 370 of the switch 100, except that the rotor pivot 1872 includes a magnet 1870, which extends through the end 1872*a* of the rotor pivot 1872, substantially perpendicular to an axis of the rotor pivot 1872 and substantially parallel to the magnet 1865. In certain exemplary embodiments, north and south poles of the magnets 1865 and 1870 are aligned with one another such that movement of the rotor pivot 1872 causes like movement of the indicator 1861 based on the magnetic attraction between the magnets 1865 and 1870. Thus, rotation of the rotor pivot 1872 during a trip of the switch 1300 can cause like rotation of the indicator 1861. Similarly, rotation of the rotor pivot 1872 during a re-activation of the switch 1300 can cause like rotation of the indicator 1861. This rotation can cause the label 1861*c* to move relative to the frame 1320*b*.

In certain exemplary embodiments, a bottom end of the frame 1320*b* includes a notch 1320*d* through which a portion of a side face 1861*d* of the indicator 1861 is visible. Similar to the label 1861*c*, the side face 1861*d* can include a label 1861*e* indicating whether the switch 1300 is "on" or "off." For example, the label 1861*e* can include a colored area that is only visible through the notch 1320*d* when the switch 1300 is off. When the switch 1300 is on, another portion of the side face 1861*d*—that does not include the label 1861*e*—can be visible within the notch 1320*d*. Thus, instead of, or in addition to, looking at the label 1861*c*, an operator can look up, at the side face 1861*d* of the installed switch 1300 to determine whether the switch 1300 is on or off.

In certain exemplary embodiments, another magnet 1875 can extend through the bottom end 1861*b* of the indicator 1861, with the magnet 1865 being disposed between the magnet 1875 and the magnet 1870. A sensor or other device can interact with the magnet 1875 to retrieve and/or output information regarding the switch 1300. For example, an electronics package (not shown) can interact with the magnet 1875 to determine the current state of the switch 1300 and/or to transmit information regarding the current state of the switch 1300 to an external device.

Figure 22:
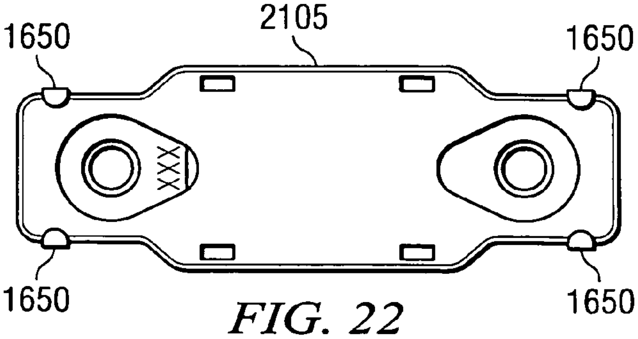
FIG. 22 is an elevational bottom side view of the exemplary sensor element and sensor element cover depicted in FIG. 21, in accordance with certain exemplary embodiments.
Figure 21:
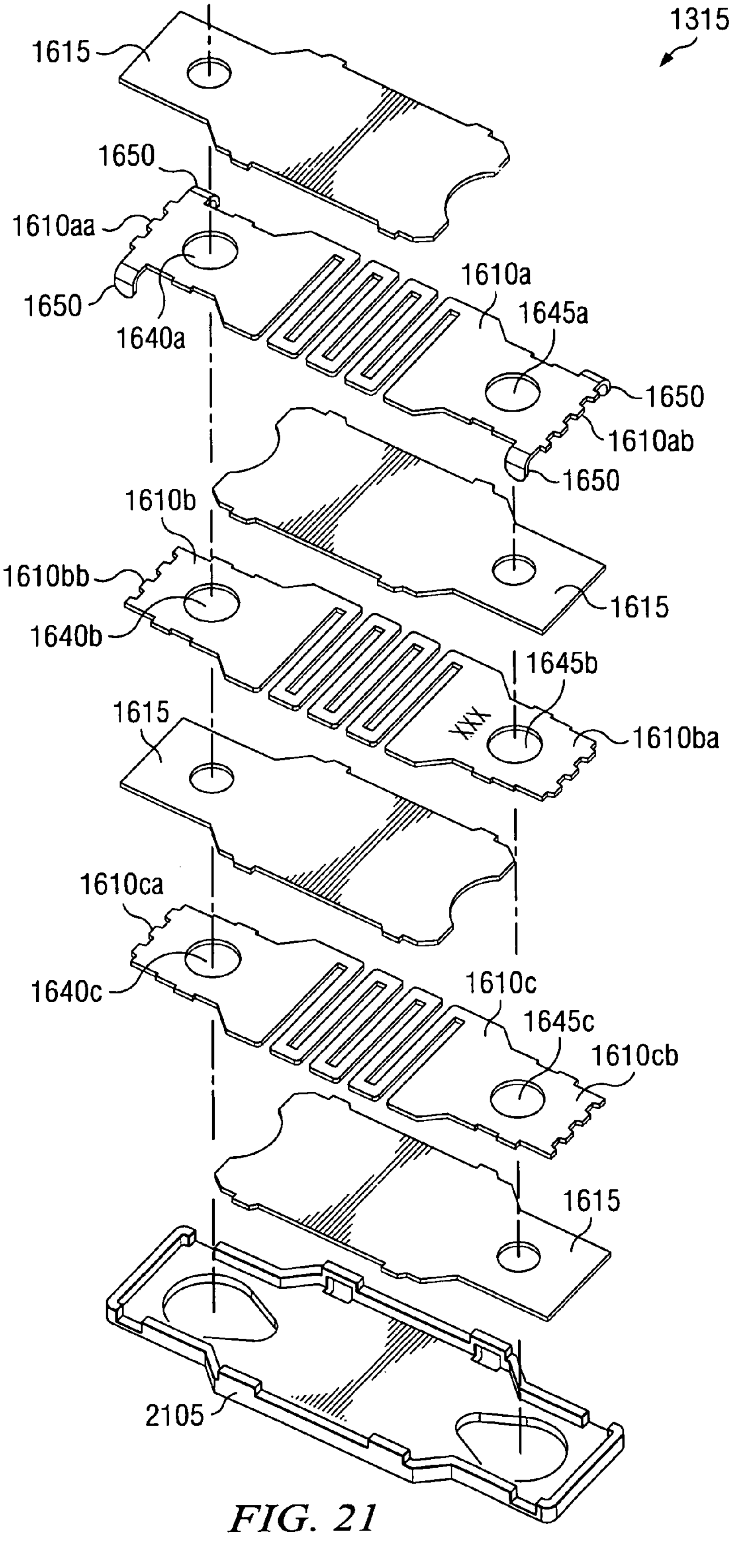
FIG. 21 is an exploded view of an exemplary sensor element and sensor element cover of the exemplary fault interrupter and load break switch depicted in FIG. 13, in accordance with certain exemplary embodiments.

FIGS. 21-22 illustrate the sensor element 1315 and a sensor element cover 2105 of the switch 1300, in accordance with certain exemplary embodiments. With reference to FIGS. 13-22, the sensor element 1315 includes at least one sensor 1610*a-c* electrically coupled to one of the stationary contacts 326 and 327 of the switch 1300. For example, the sensor element 1315 can be electrically connected between the stationary contact 327 and a primary winding (not shown) of a transformer (not shown) associated with the switch 1300.

Like the Curie metal element 390, each sensor 1610 of the sensor element 1315 includes a material, such as a nickel-iron alloy, that loses its magnetic properties when it is heated beyond a predetermined "Curie transition temperature." The resistance of the sensor element 1315 is directly related to the amount of this material present in the sensor element 1315. A sensor element 1315 with a relatively high resistance will become hotter (and thus, less magnetic) than a sensor element 1315 with a relatively low resistance, under similar operating conditions. Thus, a higher resistance sensor element 1315 can be more sensitive to certain fault conditions than a lower resistance sensor element 1315. In other words, the higher resistance sensor element 1315 can cause the switch 1300 to trip in less problematic conditions than may be required to trip a switch 1300 that includes a lower resistance sensor element 1315.

Different applications of the switch 1300 may call for different resistance levels of the sensor element 1315. For example, it may be desirable to include a higher resistance sensor element 1315 in the switch 1300 to allow fault interruption at a lower dielectric fluid temperature and/or lower current surge than if a lower resistance sensor element was employed. An operator can accommodate different resistance requirements by using different sensor elements 1315 for different applications.

In certain exemplary embodiments, a higher resistance may be achieved by using a sensor element 1315 that includes multiple sensors 1610 electrically connected in series. For example, as illustrated in FIG. 21, three sensors 1610*a-c* can be stacked together, with an insulating member 1615 disposed between each pair of neighboring sensors 1610*a-c*, between the sensor 1610*c* and the cover 2105, and between the sensor 1610*a* and the switch 1300.

Each insulating member 1615 can comprise a non-conductive material, such as polyester. In certain exemplary embodiments, each insulating member 1615 can be capable of withstanding a temperature of at least about 140 degrees. Each of the insulating members 1615 can be shaped so that the neighboring sensors 1610 can contact one another on opposite ends of the sensor element 1315. For example, an end 1610*aa* of a first sensor 1610*a* can contact an end 1610*bb* of a second sensor 1610*b*, and another end 1610*ba* of the second sensor 1610*b* can contact an end 1610*cb* of a third sensor 1610*c*. These connections can cause electric current to flow through the sensors 1610*a-c* in a "serpentine" shape. For example, electric current can flow from the stationary contact 327, through at least one terminal 1620, 1625 to an end 1610*ab* of the first sensor 1610*a*, through the first sensor 1610*a* to the end 1610*aa* of the first sensor 1610*a*, from the end 1610*aa* of the first sensor 1610*a* to the end 1610*bb* of the second sensor 1610*b*, through the second sensor 1610*b* to the end 1610*ba* of the second sensor 1610*b*, from the end 1610*ba* of the second sensor 1610*b* to the end 1610*cb* of the third sensor 1610*c*, through the third sensor 1610*c* to an end 1610*ca* of the third sensor 1610*c*, and from the end 1610*ca* to an "out" terminal 1630 (FIGS. 16-17) of the switch 1300.

In certain exemplary embodiments, at least a portion of the electric current can flow from the terminal(s) 1620, 1625 to the end 1610*ab* of the first sensor 1610*a* via a screw 1635 (FIGS. 16-17) that extends through holes 1645*a,b*, and *c* in the sensors 1610*a-c*. For example, holes 1645*b* and 1645*c* in the sensors 1610*b* and 1610*c*, respectively, can be larger in diameter than a hole 1645*a* in the sensor 1610*a* so that the screw 1635 does not contact the sensors 1610*b* and 1610*c*. Thus, electric current may flow between the screw 1635 and the sensor 1610*a*, but not between the screw 1635 and the sensors 1610*b* and 1610*c*.

Similarly, in certain exemplary embodiments, at least a portion of the electric current can flow from the end 1610*ca* of the third sensor 1610*c* to the out terminal 1630 via a screw 1646 that extends through holes 1640*a-c* in the sensors 1610*a-c*. For example, holes 1640*a* and 1640*b* in the sensors 1610*a* and 1610*b*, respectively, can be larger in diameter than a hole 1640*c* in the sensor 1610*c* so that the screw 1646 does not contact the sensors 1610*a* and 1610*b*. Thus, electric current may flow between the screw 1646 and the sensor 1610*c*, but not between the screw 1646 and the sensors 1610*a* and 1610*b*. For example, one or both of the screws 1635 and 1646 can secure the sensor element 1315 and/or sensor element cover 2105 to a bottom end of the switch 1300.

In certain exemplary embodiments, each screw 1635, 1646 can be secured to the bottom end of the switch 1300 via a nut 1647. For example, each nut 1647 can be a "captive nut," meaning that the nut 1647 is fixedly disposed within a recess in the bottom end of the switch 1300. A plastic or other material about each recess can keep each captive nut 1647 from rotating. Thus, the screws 1635, 1646 may be tightened without rotation of the captive nut 1647. In certain exemplary embodiments, a back end of each nut 1647 can include a flange configured to prevent the nut 1647 from being pushed through the recess during assembly and operation of the switch 1300. The nuts 1647 can provide a solid electrical joint for current transfer. For example, the terminal 1630 may contact the nut 1647 associated with the screw 1646, allowing electric current to flow from the screw 1646 to the nut 1647, and from the nut 1647 to the terminal 1630.

The generally serpentine path of the electric current can allow the sensor element 1315 to have a resistance of approximately three times that of a single sensor 1610, with a distance between ends of the sensor element 1315 being substantially equal to a distance between ends of the single sensor 1610. Thus, the sensor element 1315 can have an increased resistance in a relatively compact area. For example, the sensor element 1315 can fit into a standard-sized sensor element cover 1605 or support on the switch 1300.

In certain exemplary embodiments, the sensor element cover 1605 is comprised of a non-conductive material, such as plastic. An interior profile of the sensor element cover 1605 generally corresponds to a profile of the sensor element 1315. Thus, the sensor element cover 1605 can be configured to encase at least a portion of the sensor element 1315 when the sensor element 1315 is installed in the switch 1300. The sensor element cover 1605 can provide structural support to the sensor element and also can protect the sensor element 1315 from damage during shipping, installation, and damage due to rough or improper handling. In certain exemplary embodiments, one or more tabs 1650 of the sensor element 1315 can be configured to be crimped around an outer edge 1605*a* of the sensor element cover 1605 to secure the sensor element 1315 to the sensor element cover 1605.

Figure 16:
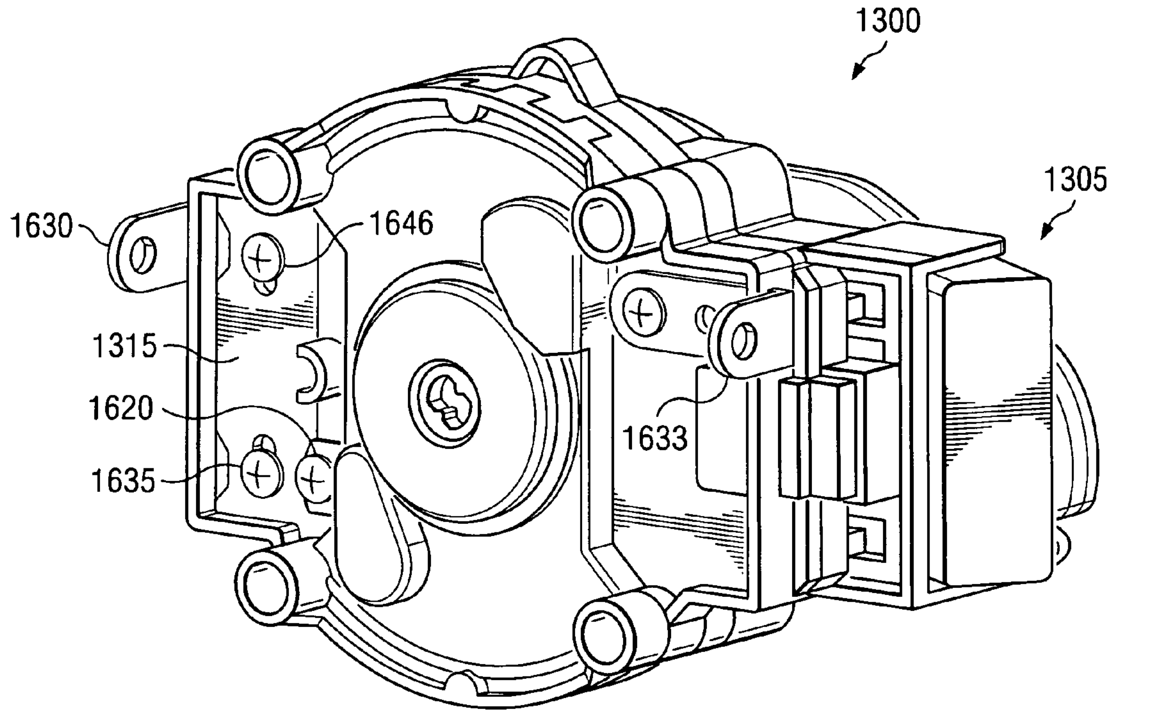
FIG. 16 is a perspective bottom view of the exemplary fault interrupter and load break switch depicted in FIG. 13, in accordance with certain exemplary embodiments.
Figure 17:
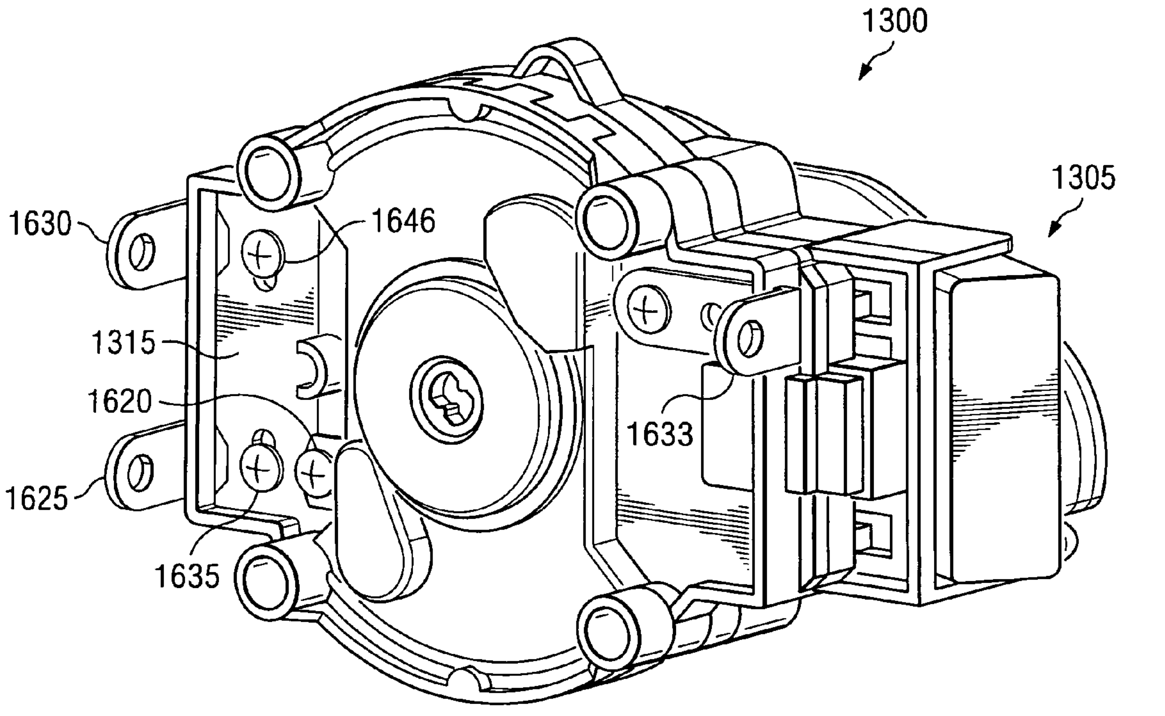
FIG. 17 is a perspective bottom view of the exemplary fault interrupter and load break switch depicted in FIG. 13, in accordance with certain exemplary embodiments.

As illustrated in FIGS. 16 and 17, in certain exemplary embodiments, the switch 1300 may or may not include the terminal 1625. For example, the terminal 1625 may be used in dual voltage transformer applications, to shunt current away from the sensor element 1315. In other applications, the terminal 1625 may not be included in the switch 1300. To ensure proper wiring of the switch 1300 within a transformer, each terminal 1625, 1630, and 1633 of the switch 1300 may be labeled. For example, the terminal 1625 may be labeled "DV," the terminal 1630 may be labeled "OUT," and the terminal 1633 may be labeled "IN."

The adjustable rating functionality of the switch 1300 allows an operator to adjust a load carrying capability of the switch 1300. For example, the adjustable rating functionality can enable the switch 1300 to handle a required overload condition, such as a current level of about twenty percent to twenty-five percent higher than switches without the adjustable rating functionality, without tripping. This functionality can be achieved by increasing the force required to trip the switch 1300. For example, the required force can be increased by increasing a force between the sensor element 1315 and the magnet 353 of the switch 1300.

As illustrated in FIG. 3, the magnet 353 may be directly coupled to a rocker 352 of the switch 1300. Alternatively, as illustrated in FIG. 15, the magnet 353 may be coupled to the rocker 352 via a magnet holder 1391. For example, the magnet holder 1391 can include a lever 1392 that contacts a bottom side of the rocker 352 when the switch is in the "on" position.

In certain exemplary embodiments, at least one magnet 1840 (FIG. 15*a*) can be used to increase the force between the sensor element 1315 and the magnet 353. For example, the magnet 1840 can be at least partially disposed within a cavity 1841 of the handle pivot 1871 of the switch 1300. A magnetic member 1845, such as a ferromagnetic metal slug, can be coupled to the rocker 352 of the switch 1300. In an exemplary embodiment, the magnetic member 1845 can be inserted into a corresponding recess 352*c* in the rocker 352. When aligned with the magnetic member 1845, the magnet 1840 can attract the magnetic member 1845, thereby exerting a magnetic force on the end 352*a* of the rocker 352. This force is in a direction away from the top surface 310*b* of the arc chamber assembly 1390 of the switch 1300. A corresponding force in the direction of the top surface 310*b* is applied to the opposite end 352*b* of the rocker 352, increasing the force between the magnet 353 and the sensor element 1315.

In certain exemplary embodiments, an operator can align the magnet 1840 and the magnetic member 1845 by rotating the handle 1320. For example, during the normal "on" position of the switch 1300, the magnet 1840 and the magnetic member 1845 are not aligned. Accordingly, the switch 1300 will trip based on the normal operating parameters. To accommodate an overload condition, the operator can rotate the handle 1320 past the normal "on" position, in a direction associated with an "off" position, of the switch 1300 to align the magnet 1840 and the magnetic member 1845. In certain exemplary embodiments, the magnet 1840 can slide over at least a portion of the magnetic member 1845 when the magnet 1840 and magnetic member 1845 are aligned. To deactivate the adjustable rating functionality, the operator can rotate the handle 1320 in the direction towards the "on" position of the switch 1300, thereby separating the magnet 1840 and the magnetic member 1845.

When the magnet 1840 and the magnetic member 1845 are aligned, both the magnetic force between them and the magnetic force between the sensor element 1315 and the magnet 353 of the switch 1300 must be overcome to trip the switch 1300. One way to overcome these magnetic forces is for a fault condition in the transformer to heat the sensor element 1315 to a sufficiently high temperature that the magnetic coupling between the sensor element 1315 and the magnet 353 is released. In certain exemplary embodiments, at least one spring 1850 associated with the magnet 353 may assist in overcoming the magnetic forces. For example, the spring 1850 can be disposed between the rocker 352 and the arc chamber assembly 1390. The spring 1850 can exert a spring force on the end 352*b* of the rocker 352, in a direction away from the top surface 310*b* of the arc chamber assembly 1390. Once the magnetic coupling between the sensor element 1315 and the magnet 353 is released, the spring force from the spring 1850 can actuate the rocker 352, releasing the trip rotor 360 to thereby trip the switch 1300, substantially as described above.

Although specific embodiments of the invention have been described above in detail, the description is merely for purposes of illustration. It should be appreciated, therefore, that many aspects of the invention were described above by way of example only and are not intended as required or essential elements of the invention unless explicitly stated otherwise. Various modifications of, and equivalent steps corresponding to, the disclosed aspects of the exemplary embodiments, in addition to those described above, can be made by a person of ordinary skill in the art, having the benefit of the present disclosure, without departing from the spirit and scope of the invention defined in the following claims, the scope of which is to be accorded the broadest interpretation so as to encompass such modifications and equivalent structures.

We claim:

1. An indicator assembly for a transformer switch, comprising:
an elongated member having a first end and a second end, the first end comprising at least one label associated with a state of the transformer switch; and
a first magnet coupled to the second end of the elongated member, the first magnet being configured to exert a force for rotating the elongated member in response to rotation of a second magnet coupled to a rotor of the transformer switch, the rotation of the second magnet occurring in response to a change of the state of the transformer switch.

2. The indicator assembly of claim 1, wherein the first end of the elongated member comprises a front face, and
wherein the label is disposed on the front face, substantially perpendicular to an axis of the elongated member.

3. The indicator assembly of claim 1, wherein the first end of the elongated member comprises a side face, and
wherein the label is disposed on the side face, substantially parallel to an axis of the elongated member.

4. The indicator assembly of claim 1, wherein the label is disposed on a front face of the elongated member, substantially perpendicular to an axis of the elongated member, and
wherein the elongated member further comprises another label disposed on a side face of the elongated member, substantially parallel to the axis of the elongated member.

5. The indicator assembly of claim 1, wherein at least a portion of the first end of the elongated member is configured to be disposed within an annular recess of a handle of the transformer switch.

6. The indicator assembly of claim 1, wherein the second end of the elongated member is configured to extend through at least one channel of the transformer switch, substantially co-linearly with an axis of the rotor.

7. The indicator assembly of claim 1, wherein the first magnet extends at least partially through the second end of the elongated member.

8. A transformer switch, comprising:
a rotor configured to be selectively positioned in a first position and a second position, the first position corresponding to a closed state of a circuit of a transformer associated with the transformer switch, the second position corresponding to an open state of the circuit;
a first magnet coupled to the rotor; and
an indicator assembly configured to indicate whether the circuit is in the open state, the indicator assembly comprising
an elongated member having a first end and a second end, the first end comprising at least one label, each label being associated with one of a closed state of the transformer switch and an open state of the transformer, and
a second magnet coupled to the second end of the elongated member, the second magnet being configured to exert a force for rotating the elongated member in response to rotation of the first magnet when the rotor is actuated between the first position and the second position.

9. The transformer switch of claim 8, wherein the first end of the elongated member comprises a front face, and
wherein the label is disposed on the front face, substantially perpendicular to an axis of the elongated member.

10. The transformer switch of claim 8, wherein the first end of the elongated member comprises a side face, and
wherein the label is disposed on the side face, substantially parallel to an axis of the elongated member.

11. The transformer switch of claim 10, further comprising a handle comprising a frame having a notch through which at least a portion of the side face of the elongated member is visible,
wherein the label is visible through the notch when the rotor is in the second position.

12. The transformer switch of claim 8, wherein the label is disposed on a front face of the elongated member, substantially perpendicular to an axis of the elongated member, and
wherein the elongated member further comprises another label disposed on a side face of the elongated member, substantially perpendicular to the axis of the elongated member.

13. The transformer switch of claim 8, further comprising a handle comprising an annular recess, at least a portion of the first end of the elongated member being disposed within the annular recess.

14. The transformer switch of claim 8, wherein the second end of the elongated member extends through at least one channel of the transformer switch, substantially co-linearly with an axis of the rotor.

15. The transformer switch of claim 1, wherein the first magnet extends at least partially through a top end of the rotor.

16. The transformer switch of claim 1, wherein the second magnet extends at least partially through the second end of the elongated member.

17. A transformer switch, comprising:
a rotor configured to be selectively positioned in a first position and a second position, the first position corresponding to a closed state of a circuit of a transformer associated with the transformer switch, the second position corresponding to an open state of the circuit;
a first magnet coupled to the rotor;
a handle coupled to the rotor and to an indicator assembly;
the indicator assembly configured to indicate whether the circuit is in the open state, the indicator assembly comprising
an elongated member having a first end and a second end, the first end having a side face comprising at least one label, each label being associated with one of a closed state of the transformer switch and an open state of the transformer, and
a second magnet coupled to the second end of the elongated member, the second magnet being configured to exert a force for rotating the elongated member in response to rotation of the first magnet when the rotor is actuated between the first position and the second position,
wherein the handle comprises a frame having a notch through which at least a portion of the side face of the elongated member is visible, the label being visible through the notch when the rotor is in the second position.

18. The transformer switch of claim 17, wherein the handle further comprises an annular recess, at least a portion of the frame being disposed around the annular recess.

19. The transformer switch of claim 18, wherein at least a portion of the first end of the elongated member is disposed within the annular recess.

20. The transformer switch of claim 17, wherein the second end of the elongated member extends through at least one channel of the transformer switch, substantially co-linearly with an axis of the rotor.

21. The transformer switch of claim 17, wherein the first magnet extends at least partially through a top end of the rotor.

22. The transformer switch of claim 17, wherein the second magnet extends at least partially through the second end of the elongated member.

* * * * *